United States Patent [19]
Ohta

[11] Patent Number: 5,691,937
[45] Date of Patent: Nov. 25, 1997

[54] STRUCTURE OF SPLIT GATE TRANSISTOR FOR USE IN A NON-VOLATILE SEMICONDUCTOR MEMORY AND METHOD OF MANUFACTURING SUCH A SPLIT GATE TRANSISTOR

[75] Inventor: Noriyuki Ohta, Tokyo, Japan

[73] Assignee: NEC Corporation, Tokyo, Japan

[21] Appl. No.: 701,013

[22] Filed: Aug. 21, 1996

[30] Foreign Application Priority Data

Aug. 25, 1995 [JP] Japan .................................. 7-217834

[51] Int. Cl.$^6$ ............................ G11C 16/04; H01L 29/68
[52] U.S. Cl. ............................ 365/185.01; 257/316
[58] Field of Search .................... 365/185.01, 185.1; 257/315, 316, 318, 319

[56] References Cited

U.S. PATENT DOCUMENTS

| | | | |
|---|---|---|---|
| 4,861,730 | 8/1989 | Hsia et al. | 437/43 |
| 5,016,215 | 5/1991 | Tigelaar | 365/185 |
| 5,349,220 | 9/1994 | Hong | 257/322 |
| 5,455,793 | 10/1995 | Amin | 365/185.26 |
| 5,508,955 | 4/1996 | Zimmer | 365/185.16 |

FOREIGN PATENT DOCUMENTS 23986  1/1990  Japan .

Primary Examiner—David C. Nelms
Assistant Examiner—Son Mai
Attorney, Agent, or Firm—Sughrue, Mion, Zinn, Macpeak & Seas, PLLC

[57] ABSTRACT

A non-volatile semiconductor memory is composed of split gate type memory cell transistors, each of which comprises a source region and a drain region formed at a principal surface of a semiconductor substrate, separately from each other to form a channel region between the source region and the drain region. This channel region is divided into a first channel region adjacent to the drain region and a second channel region adjacent to the source region. A first gate insulator film is formed on a surface of the first channel region, and a control gate electrode is formed on the first gate insulator film. An insulator layer is formed on the source region and the drain region, and a second gate insulator film is formed on an upper surface and a pair of opposite side surfaces of the control gate electrode and on a surface of the second channel region. A floating gate electrode is formed on the second gate insulator film to have opposite ends terminating on the insulator layer formed on the source region and the insulator layer formed on the drain region, respectively.

12 Claims, 16 Drawing Sheets

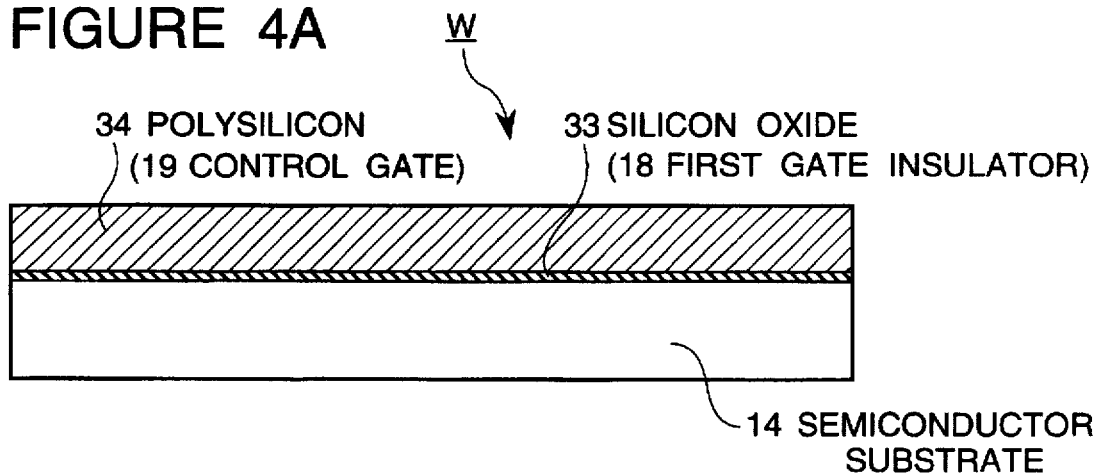
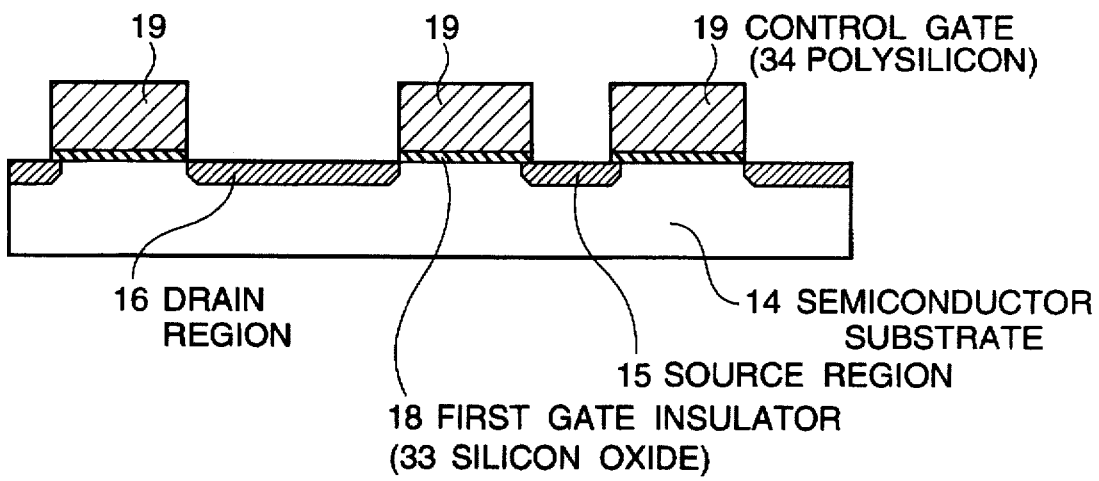
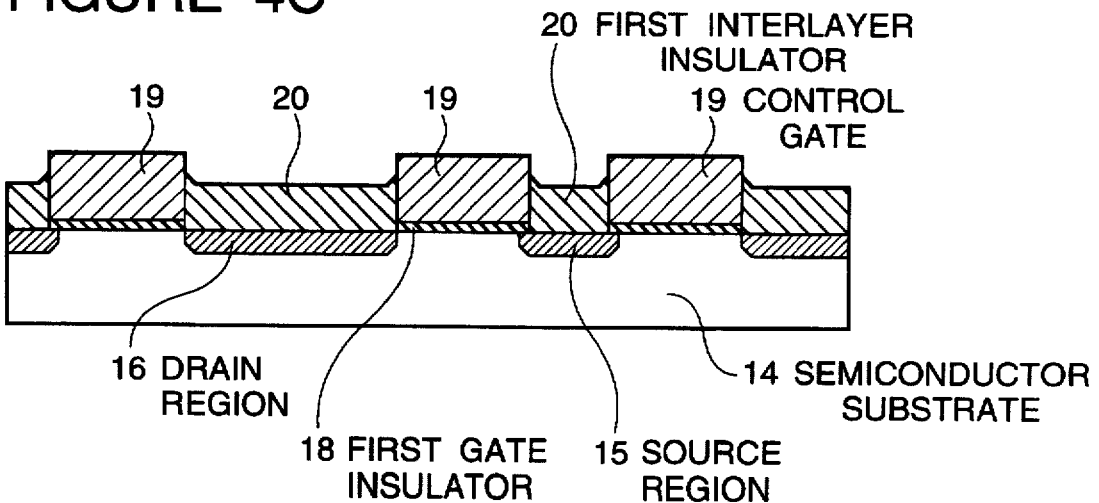

NOR ARRAY

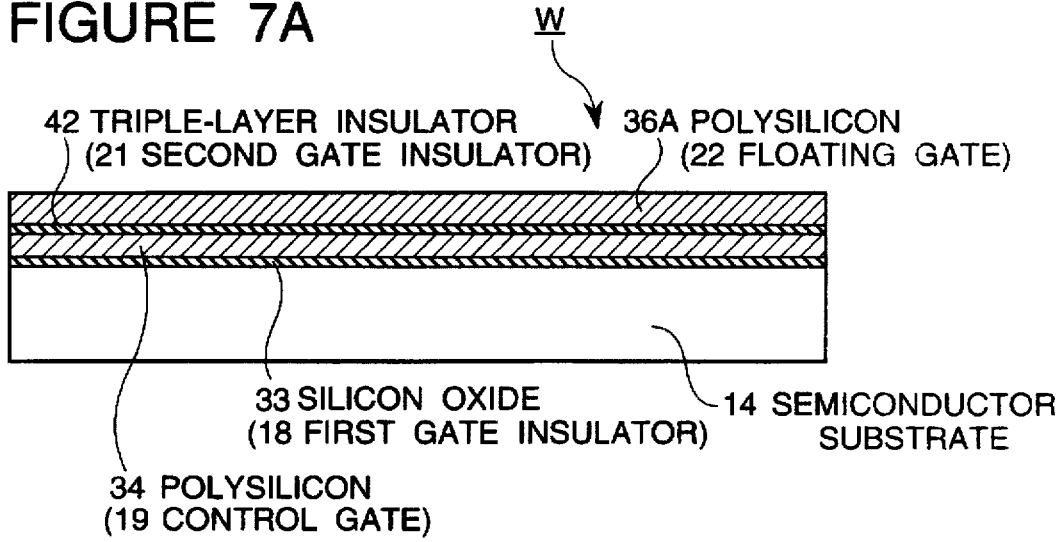
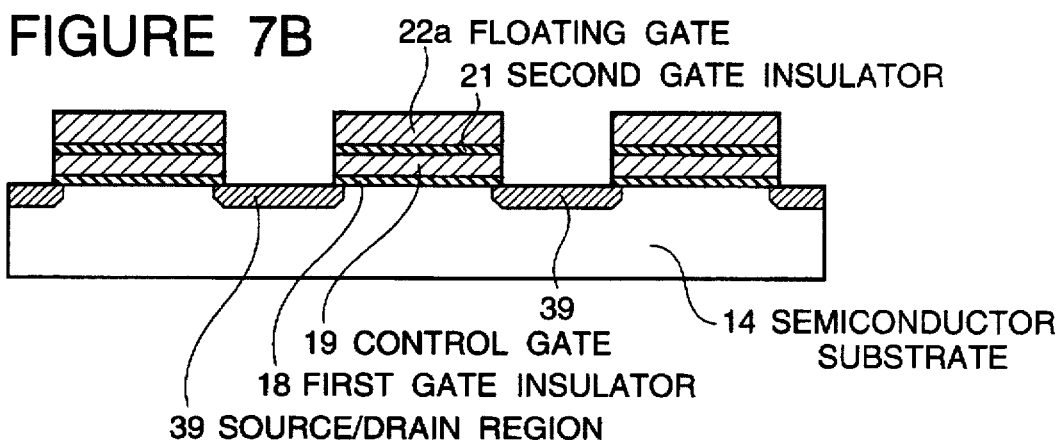
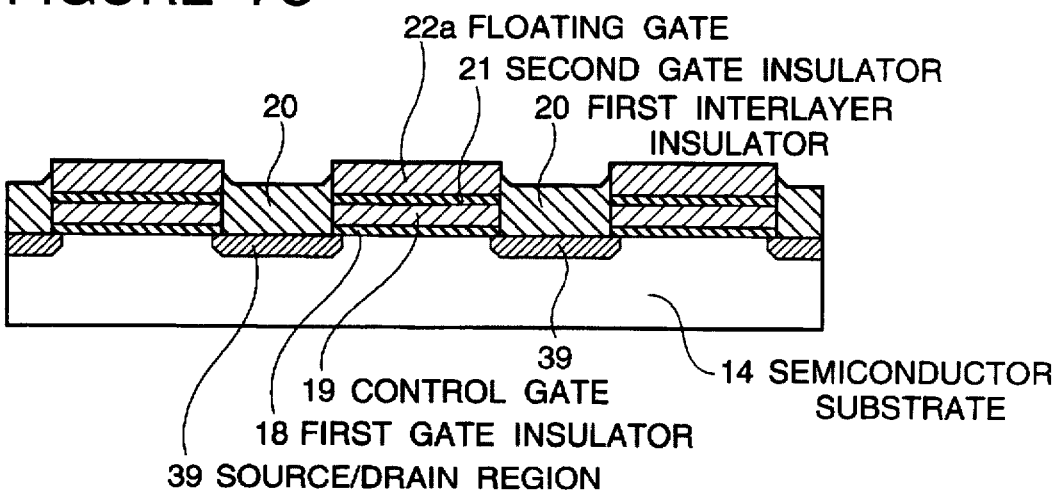

NAND ARRAY

VIRTUAL GROUND SYSTEM

STRUCTURE OF SPLIT GATE TRANSISTOR FOR USE IN A NON-VOLATILE SEMICONDUCTOR MEMORY AND METHOD OF MANUFACTURING SUCH A SPLIT GATE TRANSISTOR

BACKGROUND OF THE INVENTION

1. Field of the Invention

The present invention relates to a non-volatile semiconductor memory, and more specifically to a non-volatile semiconductor memory composed of split gate type memory cell transistors, and a method for manufacturing the same.

2. Description of Related Art

A conventional non-volatile semiconductor memory, typified by EPROM (erasable programmable read only memory) composed of split gate type memory cell transistors having two gates, namely, a floating gate and a control gate, is divided into two types, in accordance with a positional relation between the floating gate and the control gate.

A first type of the non-volatile semiconductor memory includes an underlying floating gate and an overlying control gate, as shown in a diagrammatic sectional view of FIG. 1.

As shown in FIG. 1, a source region 2 and a drain region 3 are formed on a principal surface of a semiconductor substrate 1, so that a channel region 4 is defined between the source region 2 and the drain region 3. This channel region 4 is divided into two sub-regions, namely, a first channel region 4a and a second channel region 4b. On the first channel region 4a, a first gate insulator film 5 is formed, on which a floating gate electrode 6 is formed. On the other hand, on an upper surface and opposite side surfaces of the floating gate electrode 6 and on the second channel region 4b, a second gate insulator film 7 is formed, on which a control gate electrode 8 is formed.

Furthermore, a first interlayer insulating film 9 is formed to cover the structure thus formed as mentioned above, and a contact hole 11 is formed through the first interlayer insulating film 9, to reach the drain region 3. A digit line wiring conductor 10 is formed on the first interlayer insulating film 9, to contact with the drain region 3 through the contact hole 11. In addition, a cover film 12 is formed to cover the structure thus formed.

In the process of manufacturing the above mentioned first type of non-volatile semiconductor memory, after the floating gate electrode 6 is patterned, the control gate electrode 8 is patterned. At this time, both of the second gate insulator film 7 and the floating gate electrode 6 are etched in self alignment with one end of the control gate electrode 8 (for example, the left side of the control gate electrode 8 depicted at a center in FIG. 1). But, at the opposite end of the control gate electrode 8 (for example, the right side of the control gate electrode 8 depicted at a center in FIG. 1 ), only the second gate insulator film 7 is etched.

A second type of the non-volatile semiconductor memory includes an underlying control gate and an overlying floating gate, as shown in a diagrammatic sectional view of FIG. 2. In FIG. 2, elements corresponding to those shown in FIG. 1 are given the same Reference Numerals.

As shown in FIG. 2, a source region 2 and a drain region 3 are formed on a principal surface of a semiconductor substrate 1, so that a channel region 4 is defined between the source region 2 and the drain region 3. This channel region 4 is divided into two sub-regions, namely, a first channel region 4a and a second channel region 4b. On the first channel region 4a, a first gate insulator film 5 is formed, on which a control electrode 8 is formed. On the other hand, on an upper surface and opposite side surfaces of the control electrode 8 and on the second channel region 4b, a second gate insulator film 7 is formed, on which a floating gate electrode 6 is formed.

Furthermore, a first interlayer insulating film 9 is formed to cover the structure thus formed as mentioned above, and a contact hole 11 is formed through the first interlayer insulating film 9, to reach the drain region 3. A digit line wiring conductor 10 is formed on the first interlayer insulating film 9, to contact with the drain region 3 through the contact hole 11. In addition, a cover film 12 is formed to cover the structure thus formed.

In the process of manufacturing the above mentioned second type of non-volatile semiconductor memory, after the control gate electrode 8 is patterned, the floating gate electrode 6 is patterned. Thereafter, the source region 2 and the drain region 3 are formed in self alignment with the floating gate electrode 6 and the control gate electrode 8.

However, the first and second types of the non-volatile semiconductor memory have the following disadvantages.

In the case of the first type of non-volatile semiconductor memory, as mentioned hereinbefore, when the control gate electrode 8 is patterned, the second gate insulator film 7 and the floating gate electrodes 6 are sequentially etched in self alignment with the one edge of the control gate electrode 8. However, at the other edge of the control gate electrode 8, the semiconductor substrate 1 is exposed after the second gate insulator film 7 is etched. Therefore, in the process of etching the floating gate electrode 6 at the one edge of the control gate electrode 8, the semiconductor substrate 1 is etched or dug down at the other edge of the control gate electrode 8. This etching or digging-down of the semiconductor substrate 1 produces an offset between the channel region 4 and the source region 2, and at the same time, induces damage in the semiconductor substrate, resulting in a crystal defect, which becomes a cause of a leak current.

On the other hand, in the case of the second type of non-volatile semiconductor memory, as mentioned hereinbefore, the control gate electrode 8 is patterned, and then, the second gate insulator film 7 is formed, and thereafter, the floating gate electrode 6 is patterned. At this time, the channel length of the memory cell transistor is determined by the sum of the length of the control gate electrode 8 and the length of the portion of the floating gate electrode 6 which does not overlap with the control gate electrode 8. Therefore, in the case that the floating gate electrode 6 is mis-aligned with the control gate electrode 8 when the floating gate electrode 6 is patterned, the channel length changes. This results in that the characteristics of memory cell transistors cannot be stably maintained at a constant level, so that the manufacturing yield of the production drops.

In order to overcome the above mentioned disadvantages, Japanese Patent Application Laid-open Publication No. JP-A-2-003986 (which corresponds to U.S. Pat. No. 4,861, 730) has proposed one method for manufacturing a non-volatile semiconductor memory cell. In this proposed method, similarly to the manufacturing process for the first type of non-volatile semiconductor memory, each one floating gate electrode is patterned in units of two memory cell transistors, and then, the second gate insulator film layer and the control gate electrode layer are grown in the named order. Thereafter, only the control gate electrode layer is patterned to form one discrete control gate electrode for each one of each two memory cell transistors. Furthermore, a mask is formed and an etching is performed to divide only the floating gate electrode in common to each two memory cell transistors, into two floating gate electrodes each of which corresponds to one of each two memory cell transistors.

With this process, at one edge of the control gate electrode, the control gate electrode and the floating gate electrode are formed in self-alignment with each other, and at the other edge of the control gate electrode, the digging-down of the semiconductor substrate is prevented.

However, the following disadvantages have been encountered in this proposed method: Namely, when a photoresist is used for the masking at the time of patterning the control gate electrode, if, in the next step, a masking is carried out to divide only the floating gate electrode, the two photoresist films are resultantly formed in a stacked manner. In this case, there is possibility that various problems such as uneven coating of the photoresist and fusion of the photoresist, occur.

On the other hand, if a silicon oxide film is used for the masking at the time of patterning the control gate electrode, when the floating gate electrode is etched in the next step, the silicon oxide film deposited on the control gate electrode positioned on the floating gate electrode is also etched together, with the result that the silicon oxide film provided as the mask may not completely exert the function of the etching mask. Namely, etching quality drops. If this problem actually occurs, it is no longer possible to manufacture the products.

SUMMARY OF THE INVENTION

Accordingly, it is an object of the present invention to provide a non-volatile semiconductor memory and a method for manufacturing the same, which have overcome the above mentioned defects of the conventional ones.

Another object of the present invention is to provide a non-volatile semiconductor memory having a structure which can stably maintain the characteristics of memory cell transistors at a constant level, and a method for manufacturing the same.

The above and other objects of the present invention are achieved in accordance with the present invention by a non-volatile semiconductor memory composed of split gate type memory cell transistors each having a floating gate electrode and a control gate electrode, wherein each of the memory cell transistors comprises first and second source/drain regions formed at a principal surface of a semiconductor substrate, separately from each other, to form a channel region between the first and second source/drain regions, the channel region being divided into a first channel region adjacent to the first source/drain region and a second channel region adjacent to the second source/drain region, a first gate insulator film formed on a surface of the first channel region, a first gate electrode formed on the first gate insulator film, an insulator layer formed on a surface of each of the first and second source/drain regions, a second gate insulator film formed on an upper surface and a pair of opposite side surfaces of the first gate electrode and on a surface of the second channel region, and a second gate electrode formed on the second gate insulator film and having opposite ends terminating on the insulator layer formed on the surface of the first source/drain region and the insulator layer formed on the surface of the second source/drain region, respectively, one of the first and second gate electrodes constituting the floating gate electrode, and the other of the first and second gate electrodes constituting the control gate electrode.

According to a second aspect of the present invention, there is provided a non-volatile semiconductor memory composed of split gate type memory cell transistors each having a floating gate electrode and a control gate electrode, wherein each of the memory cell transistors comprises first and second source/drain regions formed at a principal surface of a semiconductor substrate, separately from each other to form a channel region between the first and second source/drain regions, the channel region being divided into a first channel region adjacent to the first source/drain region and a second channel region adjacent to the second source/drain region, a first gate insulator film formed on a surface of the first channel region, a first gate electrode formed on the first gate insulator film, a second gate insulator film formed on the first gate electrode, an insulator layer formed on a surface of each of the first and second source/drain regions, a third gate insulator film formed to cover at least a surface of the second channel region and one side surface of a pair of opposite side surfaces of the first gate electrode adjacent to said the second channel region, and a second gate electrode formed on the second and third gate insulator films and having opposite ends terminating on the insulator layer formed on the surface of the first source/drain region and the insulator layer formed on the surface of the second source/drain region, respectively, one of the first and second gate electrodes constituting the floating gate electrode, and the other of the first and second gate electrodes constituting the control gate electrode. 5

According to a third aspect of the present invention, there is provided a method for manufacturing a non-volatile semiconductor memory composed of split gate type memory cell transistors each having a floating gate electrode and a control gate electrode, the method comprising the steps of forming a first gate electrode on a first gate insulator film formed on a principal surface of a semiconductor substrate, forming first and second source/drain regions at the principal surface of the semiconductor substrate at opposite sides of the first gate electrode, in a self-alignment with the first gate electrode, so that a channel region is formed at the principal surface of the semiconductor substrate under the first gate electrode, forming an insulator layer to cover a surface of the first and second source/drain regions, removing a portion of the first gate electrode adjacent to the first source/drain region in a channel length direction, forming a second gate insulator film on an upper surface and a pair of opposite side surface of the remaining first gate electrode and on the principal surface of the semiconductor substrate from which the portion of the first gate electrode has been removed, and forming a second gate electrode to cover the second gate insulator film and to have opposite ends terminating on the insulator layer formed on the surface of the first source/drain region and the insulator layer formed on the surface of the second source/drain region, respectively, so that one of the first and second gate electrodes constitutes the floating gate electrode, and the other of the first and second gate electrodes constitutes the control gate electrode.

According to a fourth aspect of the present invention, there is provided a method for manufacturing a non-volatile semiconductor memory composed of split gate type memory cell transistors each having a floating gate electrode and a control gate electrode, the method comprising the steps of forming on a principal surface of a semiconductor substrate a stacked layer structure composed of a first gate insulator film, a first gate electrode, a second gate insulator film and a first portion of a second gate electrode portion, stacked in the named order, forming first and second source/drain regions at opposite sides of the stacked layer structure, in a self-alignment with the stacked layer structure, so that a channel region is formed under the stacked layer structure, forming an insulator layer to cover a surface of the first and second source/drain regions, removing a portion of the stacked layer structure adjacent to a first end of each of the source/drain regions in a channel length direction, forming a third gate insulator film on at least a side surface of the remaining stacked layer structure and the principal surface of the semiconductor substrate from which the portion of the stacked layer structure has been removed, forming a second portion of the second gate electrode on the third gate insulator formed on the principal surface of the semiconductor substrate, forming a third portion of the second gate electrode to cover the second portion of the second gate electrode and the first portion of the second gate electrode of the remaining stacked layer structure and to have opposite ends respectively terminating on the insulator layer formed on the surface of the first source/drain region and the insulator layer formed on the surface of the second source/drain region, respectively, so that one of the first and second gate electrodes constitutes the floating gate electrode, and the other of the first and second gate electrodes constitutes the control gate electrode.

In a specific embodiment, the insulator film is formed to partially cover a first side surface of the stacked layer structure but an upper surface of the stacked layer structure is put in an exposed condition, and wherein the third gate insulator film is formed to cover an upper surface of the remaining stacked layer structure, a remaining portion of the first side surface of the stacked layer structure and a whole of a second side surface of the stacked layer structure opposite to the first side surface, and the principal surface of the semiconductor substrate from which the portion of the first gate electrode has been removed, and then, the third gate insulator film formed to cover the upper surface of the remaining stacked layer structure is selectively removed so that a surface of the first portion of the second gate electrode in the remaining stacked layer structure is exposed.

The above and other objects, features and advantages of the present invention will be apparent from the following description of preferred embodiments of the invention with reference to the accompanying drawings.

BRIEF DESCRIPTION OF THE DRAWINGS

FIGS. 4A to 4I are diagrammatic sectional views for illustrating the process in accordance with the present invention for manufacturing the first embodiment of the non-volatile semiconductor memory shown in FIG. 3;

FIGS. 7A to 7I are diagrammatic sectional views for illustrating the process in accordance with the present invention for manufacturing the second embodiment of the non-volatile semiconductor memory shown in FIG. 6;

DESCRIPTION OF THE PREFERRED EMBODIMENTS

Figure 1:
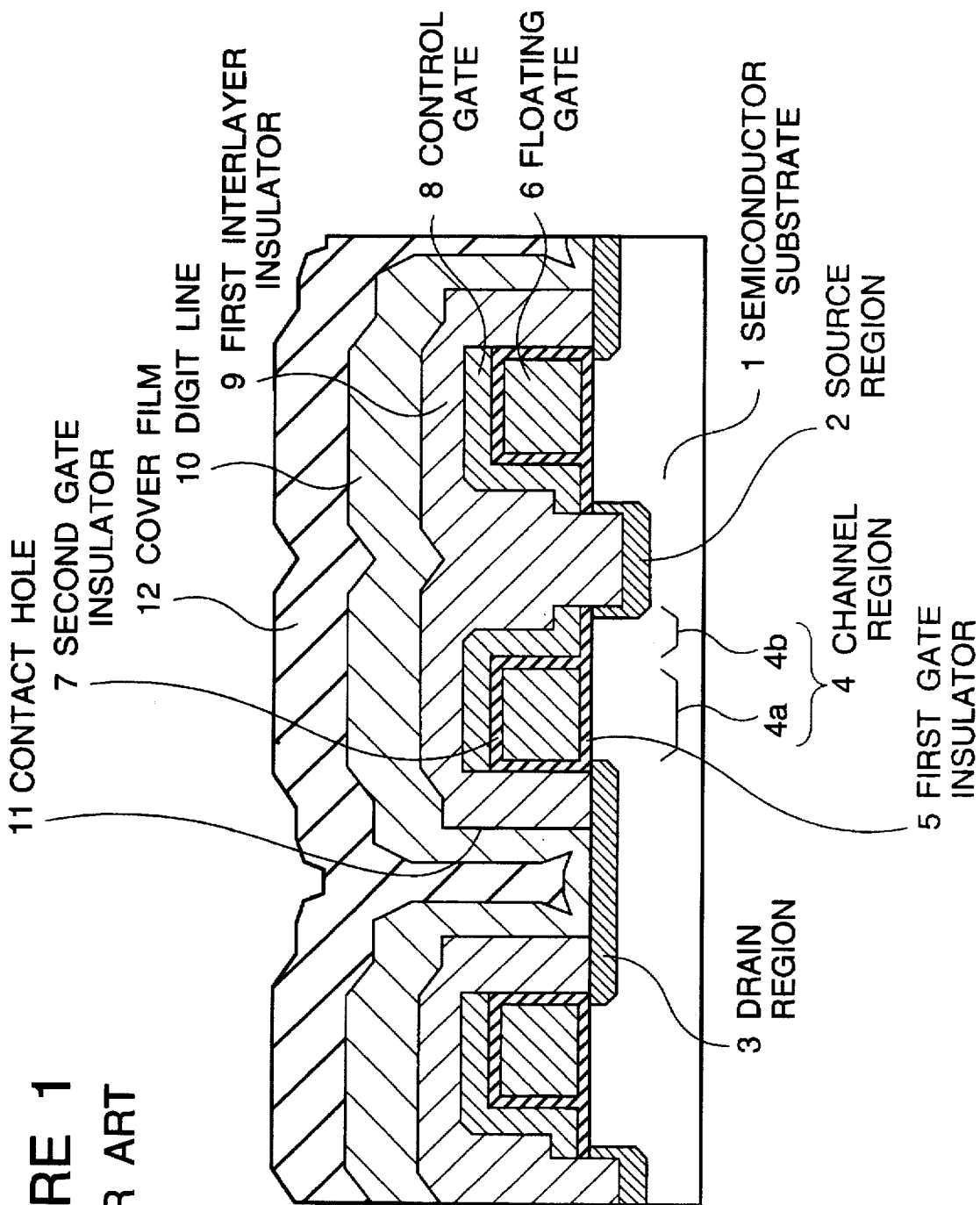
FIG. 1 is a diagrammatic sectional view of a conventional first type of non-volatile semiconductor memory including an underlying floating gate and an overlying control gate.
Figure 2:
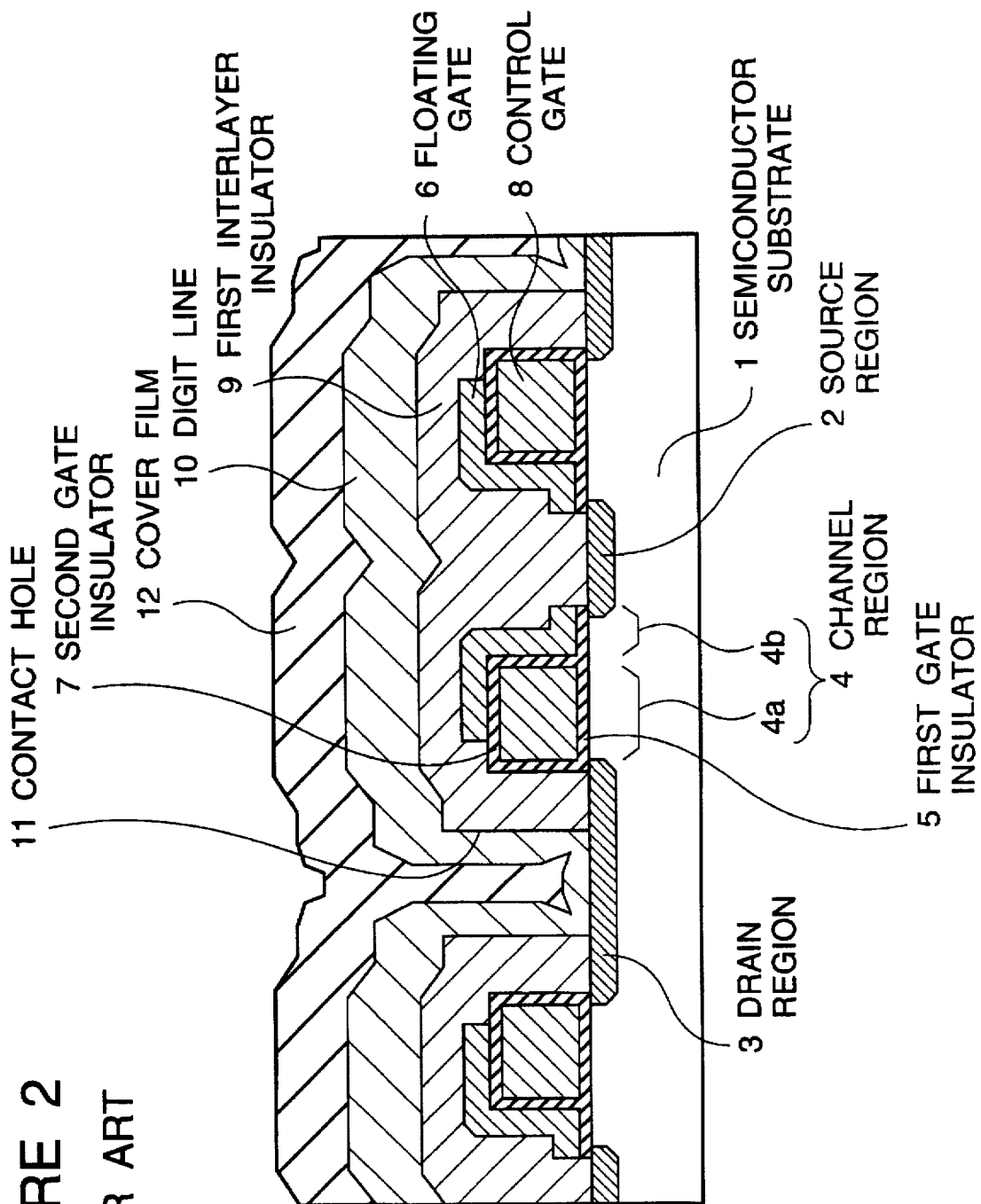
FIG. 2 is a diagrammatic sectional view of a conventional second type of non-volatile semiconductor memory including an underlying control gate and an overlying floating gate.
Figure 3:
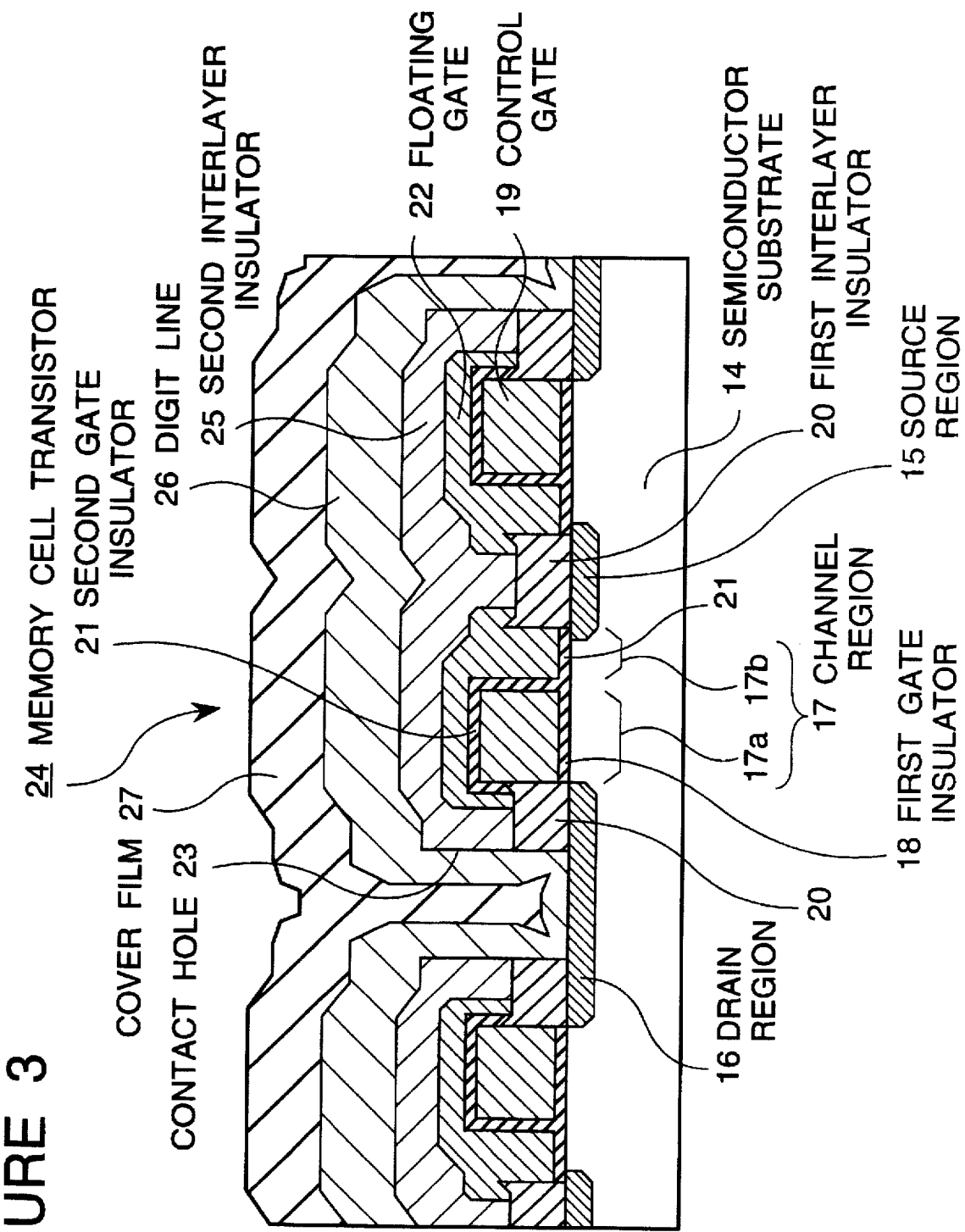
FIG. 3 is a diagrammatic sectional view of a first embodiment of the non-volatile semiconductor memory in accordance with the present invention.

Referring to FIG. 3, there is shown a diagrammatic sectional view of a first embodiment of the non-volatile semiconductor memory in accordance with the present invention.

This first embodiment includes an underlying control gate and an overlying floating gate, and is of the same type as that of the conventional second type of non-volatile semiconductor memory.

The shown first embodiment includes a semiconductor substrate 14, on which a number of memory cell transistors 24 are formed. For simplification of the drawing, only three memory cell transistors 24 are shown in FIG. 3. Each memory cell transistor 24 has a source region 15 and a drain region 16 formed at a principal surface of the substrate 14, separately from each other, so that a channel region 17 is formed between the source region 15 and the drain region 16. The channel region 17 is divided into two portions, namely, a first channel region 17a adjacent to the drain region 16 and a second channel region 17b adjacent to the source region 15. On the first channel region 17a, a first gate insulator film 18 and a control gate electrode 19 are formed in the named order. A first interlayer insulator film 20 is formed on the source region 15 and on the drain region 16 excluding a contact hole 23. Furthermore, a second gate insulator film 21 is formed on an upper surface of the control gate electrode 19, a pair of opposite side surfaces of the control gate electrode 19, other than that in contact with the first interlayer insulator film 20, and a surface of the second channel region 17b. A floating gate electrode 22 is formed to cover the second gate insulator film 21 and to have opposite ends terminating on the first interlayer insulator film 20 formed on the source region 15 and on the first interlayer insulator film 20 formed on the drain region 16, respectively. Thus, the memory cell transistor 24 is completed.

Furthermore, a second interlayer insulator film 25 is coated on the floating gate electrode 22 and the first interlayer insulator film 20, and a digit line conductor 26 is formed on the second interlayer insulator film 25 so that the digit line conductor 26 is contacted with the drain region 16 through the contact hole 23. This digit line interconnects the drain region of memory cell transistors included in one row or in one column. The digit line 26 is covered with an insulative cover film 27. Thus, a NOR array is constituted as shown in FIG. 5.

Figure 5:
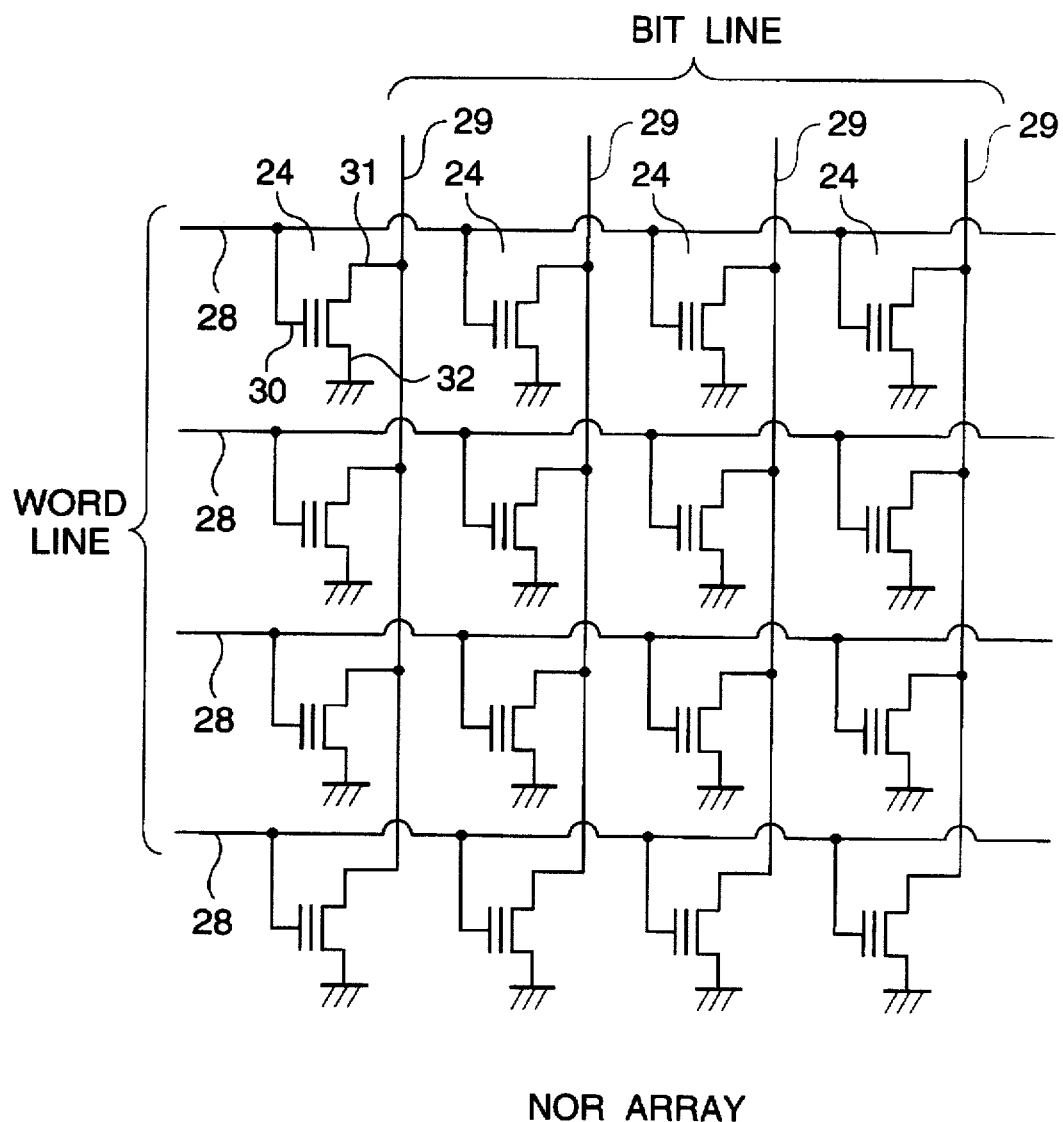
FIG. 5 is a circuit diagram of a memory cell array of the first embodiment of the non-volatile semiconductor memory shown in FIG. 3.

As shown in FIG. 5, each one memory cell transistor is located at each of intersections between a number of word lines 28 and a number of bit lines 29. Each one memory cell transistor has a gate 30 (control gate electrode 19) connected to a corresponding word line 28, a drain 31 (drain region 16) connected to a corresponding bit line 29 (digit line 26), 20 and a source 32 (source region 15) connected to ground. Therefore, to one bit line 29, a number of memory cell transistors 24 included in a column corresponding to the bit line 29 are connected in parallel to each other.

Now, a process for manufacturing the first embodiment of the non-volatile semiconductor memory shown in FIG. 3 will be described with reference to FIGS. 4A to 4I.

As shown in FIG. 4A, on a wafer W such as a P-type silicon substrate 14 having an impurity concentration of $1 \times 10^{15}$ cm$^{-3}$, a silicon oxide film 33 having a thickness of 20 nm (which will become the first gate insulator film 18) and a phosphorus-diffused polysilicon film 34 having a thickness of 300 nm (which will become the control gate electrode 19) are deposited in the named order.

Then, as shown in FIG. 4B, the polysilicon film 34 is patterned in accordance with a known manner so as to form the control gate electrodes 19, and a source region 15 and the drain region 16 are formed in a self-alignment with the control gate electrode 19 also in accordance with a known manner. Thereafter, the silicon oxide film 33, which is not covered with the control gate electrode 19, may be removed as shown in FIG. 4B, but may be or may not be maintained if the first interlayer insulator film 20 to be formed in the next step is formed of the same material as that of the silicon oxide film 33.

Furthermore, as shown in FIG. 4C, in accordance with a known manner, the first interlayer insulator film 20 is deposited on the source region 15 and the drain region 16, so that a space between the control gate electrodes 19 is charged with the deposited first interlayer insulator film 20, but an upper surface of the control gate electrode 19 is in an exposed condition. For this purpose, an interlayer insulator may be firstly deposited to cover the whole of the substrate, namely to cover not only the space between the control gate electrodes 19 but also the control gate electrodes 19, and then, the deposited interlayer insulator is removed back so that the upper surface of the control gate electrode 19 is exposed but the space between the control gate electrodes 19 is charged with the remaining deposited insulator. Alternatively, an interlayer insulator may be selectively deposited to charge only the space between the control gate electrodes 19 while maintaining the upper surface of the control gate electrode 19 in an exposed condition.

Figure 4D:
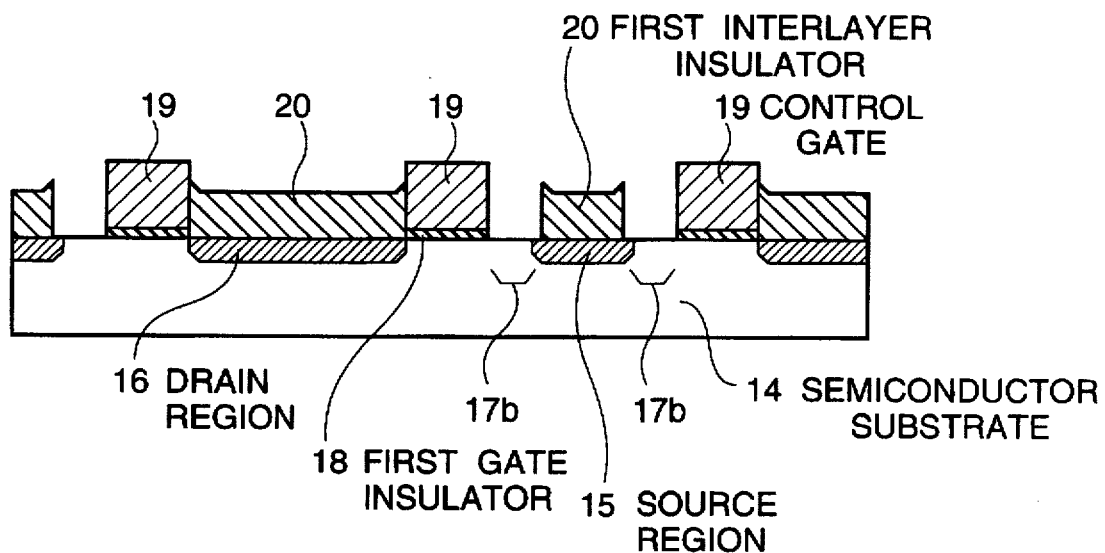

Then, as shown in FIG. 4D, a portion of each stacked structure composed of the control gate electrode 19 and the first gate insulator film 18, adjacent to the source region 15 in a channel length direction, is selectively etched and removed in accordance with a known manner. This removed region corresponds to the second channel region 17b.

Figure 4E:
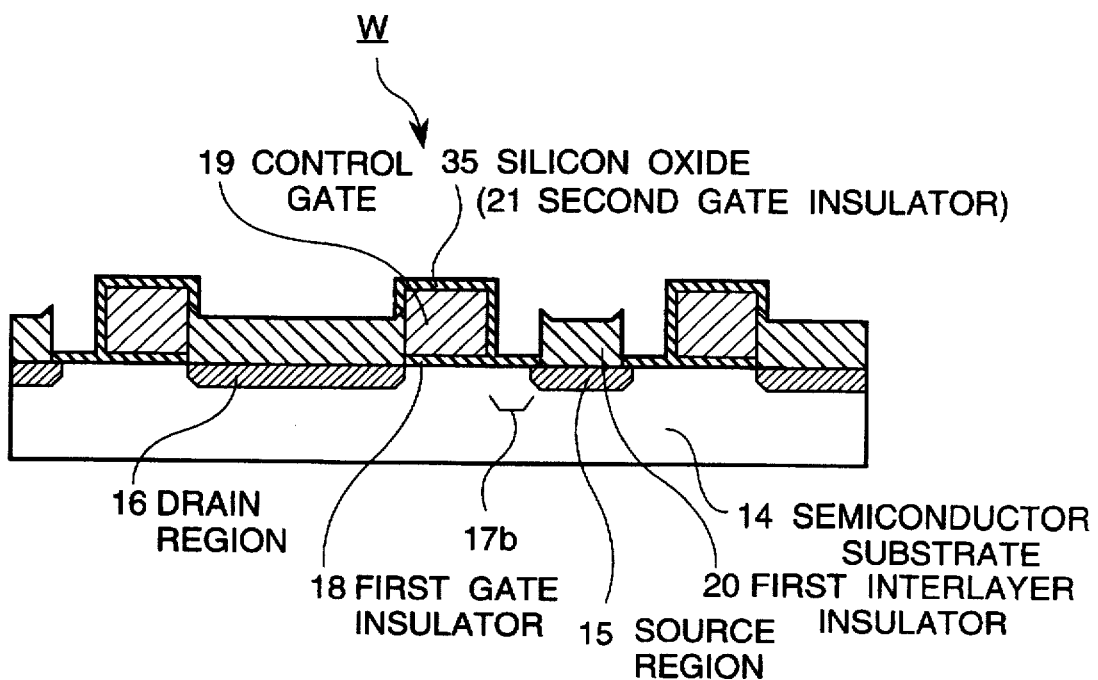

And, as shown in FIG. 4E, a silicon oxide film 35 having a thickness of 10 nm, which will become the second gate insulator film 21, is grown on an exposed surface of the polysilicon film 34 and the substrate 14, namely, on an upper surface of the control gate electrode 19, a portion of a side surface of the control gate electrode 19 which is adjacent to the first interlayer insulator film 20 but is not covered with the first interlayer insulator film 20, an opposite side surface of the control gate electrode 19, and an upper surface of the second channel region 17b.

Figure 4F:
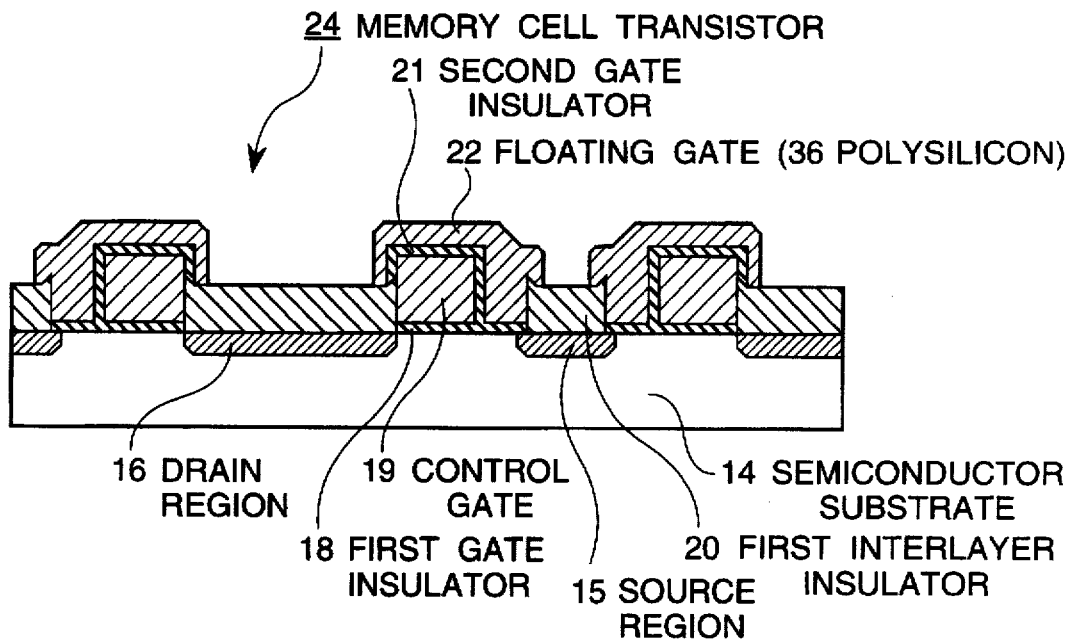

Thereafter, a polysilicon film 36 having a thickness of 200 nm is grown on the whole of the wafer W, and phosphorus is ion-implanted to the grown polysilicon film 36 with a dose of $5 \times 10^{14}$ cm$^{-2}$ under an acceleration energy of 40 keV. Furthermore, as shown in FIG. 4F, the polysilicon film 36 is patterned in accordance with a known manner so as to form the floating gate electrode 22 having opposite ends terminating on the two first insulator interlayer insulator film portions 20 and 20 located on the source region 15 and the drain region 16, respectively. With the process as mentioned above, the memory cell transistor 24 is formed.

Figure 4G:
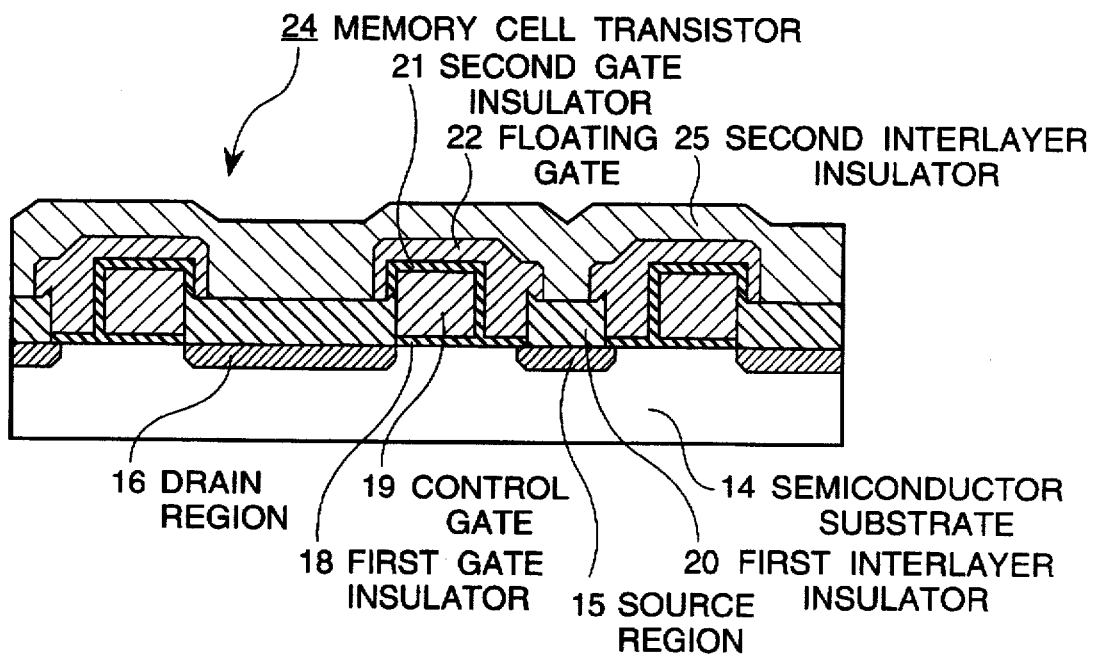

Then, as shown in FIG. 4G, a second interlayer insulator film 25 composed of a BPSG (borophosphosilicate glass) film having a thickness of 500 nm is formed to cover the memory cell transistor 24.

Figure 4H:
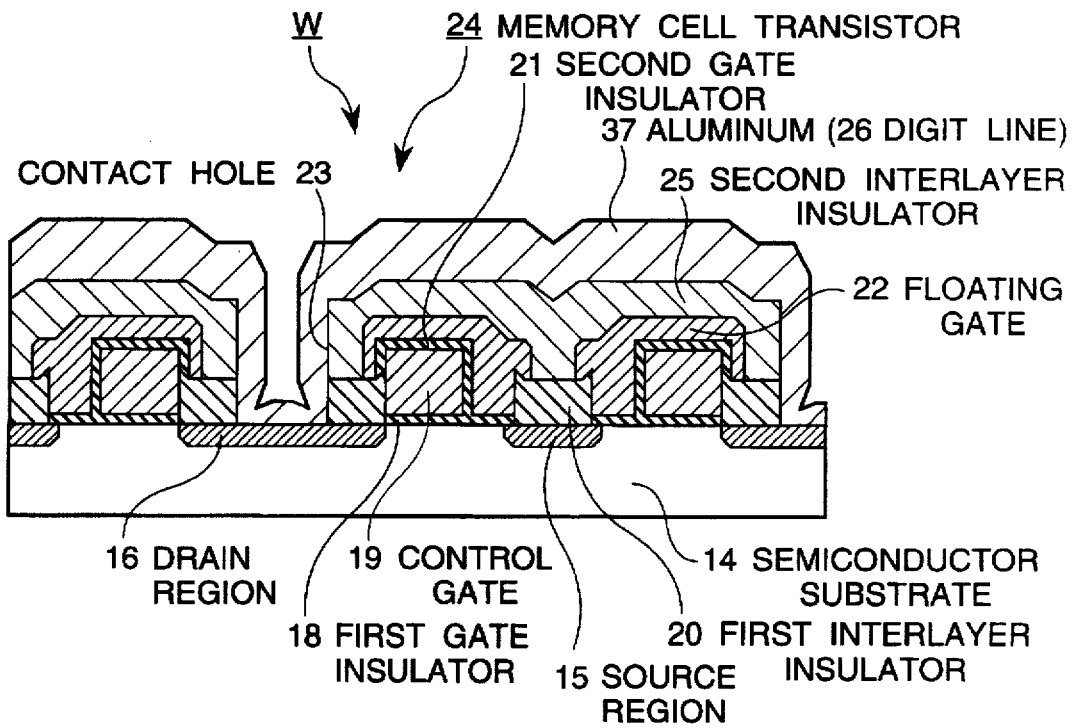

Furthermore, as shown in FIG. 4H, the contact hole 23 is formed in accordance with a known manner to pass through the first and second interlayer insulator films 20 and 25 located on the drain region 16, and to expose a portion of the surface of the drain region 16. Then, an aluminum film 37 having a thickness of 1000 nm is deposited by a sputtering, and then, patterned to form the digit line conductor 26.

Figure 4I:
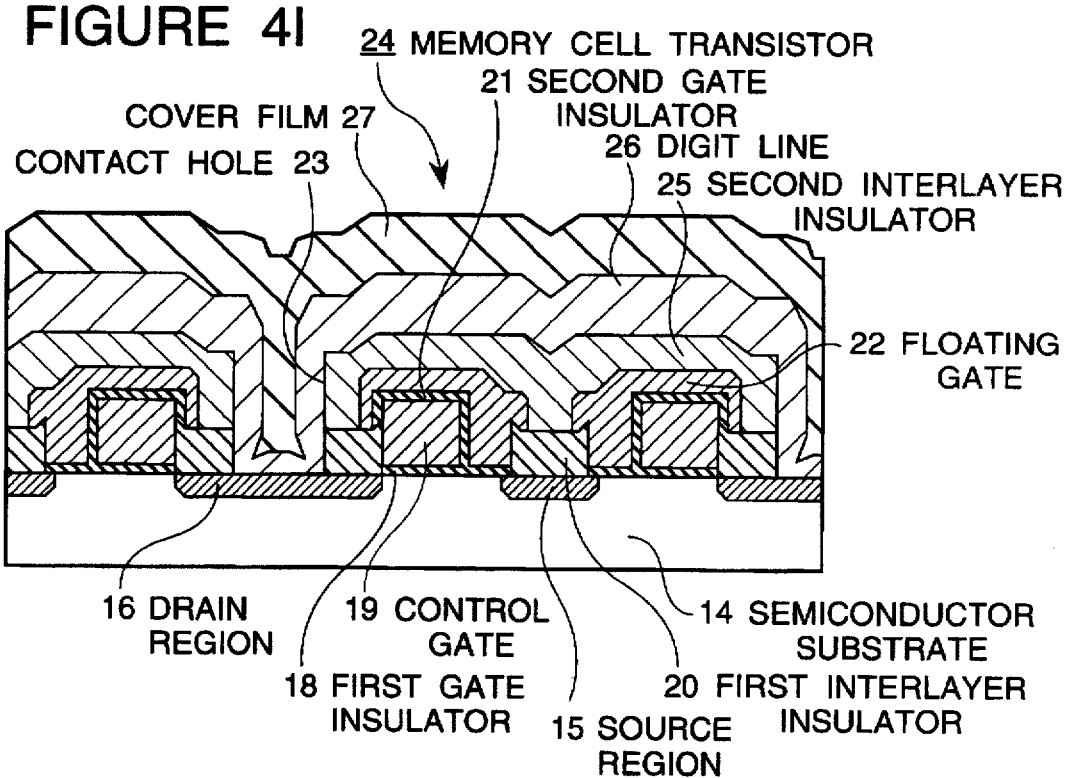

Finally, as shown in FIG. 4I, the cover film 27 is deposited to cover the memory cell transistors 24 and the digit line conductor 26. Thus, the first embodiment of the non-volatile semiconductor memory is completed.

Differently from the conventional second type of non-volatile semiconductor memory mentioned hereinbefore having the disadvantage that the channel length of the memory cell transistors is varied or swayed by the degree of alignment between the control gate electrode and the floating gate electrode, the above mentioned embodiment of the manufacturing method in accordance with the present invention is characterized that, after the control gate electrode 19 is patterned, but before the floating gate electrode 22 is formed, the source region 15 and the drain region 16 are formed in a self-alignment with the control gate electrode. Therefore, the channel length of the memory cell transistor 24 is unambiguously or directly determined by only the size of the control gate electrode 19. Therefore, variation of the characteristics of the memory cell transistors due to the manufacturing process can be reduced, with the result that the manufacturing yield of the products can be stably maintained at a constant level.

Furthermore, in the conventional first type of non-volatile semiconductor memory mentioned hereinbefore, when the overlying gate electrode (control gate electrode) is patterned, the underlying gate electrode (floating gate electrode) is etched in a self-alignment with the overlying gate electrode at one edge side of the overlying gate electrode, but the semiconductor substrate is exposed at the other edge side of the overlying gate electrode. Namely, an etching pattern at opposite sides of the overlying gate electrode is asymmetric. On the other hand, the above mentioned embodiment of the manufacturing method in accordance with the present invention is characterized that, as shown in FIG. 4F, when the overlying gate electrode (floating gate electrode 22) is patterned, it is not necessary at all to etch the underlying gate electrode (control gate electrode 19) in a self-alignment with the overlying gate electrode at opposite edges of the overlying gate electrode, but it is sufficient if the overlying gate electrode is etched until the surface of the first interlayer insulator film 20 is exposed. Namely, the etching pattern may be said to be symmetric. Accordingly, the semiconductor substrate is never dug down. Therefore, there occurs no offset between the channel region and the source region, and at the same time, it is possible to avoid damages in the semiconductor substrate, which would otherwise result in a crystal defect becoming a cause of a leak current.

Now, a second embodiment of the non-volatile semiconductor memory in accordance with the present invention will be described with reference to FIG. 6, in which, elements similar to those shown in FIG. 3 are given the same Reference Numerals.

The memory cell transistor of this second embodiment has an overlying floating gate electrode and the underlying control gate electrode, similarly to the first embodiment of the non-volatile semiconductor memory in accordance with the present invention. However, the second embodiment is different from the first embodiment in that (1) in place of the single layer of the control gate electrode, three stacked layers composed of the floating gate electrode, the second gate insulator film and the control gate electrode are used as a self-aligning mask for forming the source region and the drain region, and (2) the structure of the memory cell array is of a NAND type, not the NOR type.

The shown second embodiment includes a semiconductor substrate 14, on which a number of memory cell transistors 41 are formed. For simplification of the drawing, only three memory cell transistors 41 are shown in FIG. 6. Each memory cell transistor 41 has a pair of source/drain regions 39 formed at a principal surface of the substrate 14, separately from each other, so that a channel region 17 is formed between the pair of source/drain regions 39. The channel region 17 is divided into two portions, namely, a first channel region 17a adjacent to one of the pair of source/drain regions 39 and a second channel region 17b adjacent to the other of the pair of source/drain regions 39. On the first channel region 17a, a first gate insulator film 18, a control gate electrode 19 and a second gate insulator film 21 are formed in the named order. A first interlayer insulator film 20 is formed on each of the pair of source/drain regions 39. Furthermore, a third gate insulator film 40 is formed to cover a side surface of the control gate electrode 19 which does not contact with the first interlayer insulator film 20, and a surface of the second channel region 17b, so as to further extend upward from the side surface concerned of the control gate electrode 19. A floating gate electrode 22 is formed to cover the second and third gate insulator films 21 and 40 and to have opposite ends terminating on the two adjacent first interlayer insulator film portions 20, respectively.

Furthermore, a second interlayer insulator film 25 is coated to cover the floating gate electrode 22 and the first interlayer insulator film 20, and an insulative cover film 27 is formed to overcoat the second interlayer insulator film 25. On the other hand, this memory cell transistor 41 has no contact hole. In addition, each source/drain region 39 functions as a source region for one of a pair of adjacent memory cell transistors, and also as a drain region for the other of the same pair of adjacent memory cell transistors. Thus, the NAND type of memory cell array as shown in FIG. 8 is constituted with a high degree of integration density.

Figure 8:
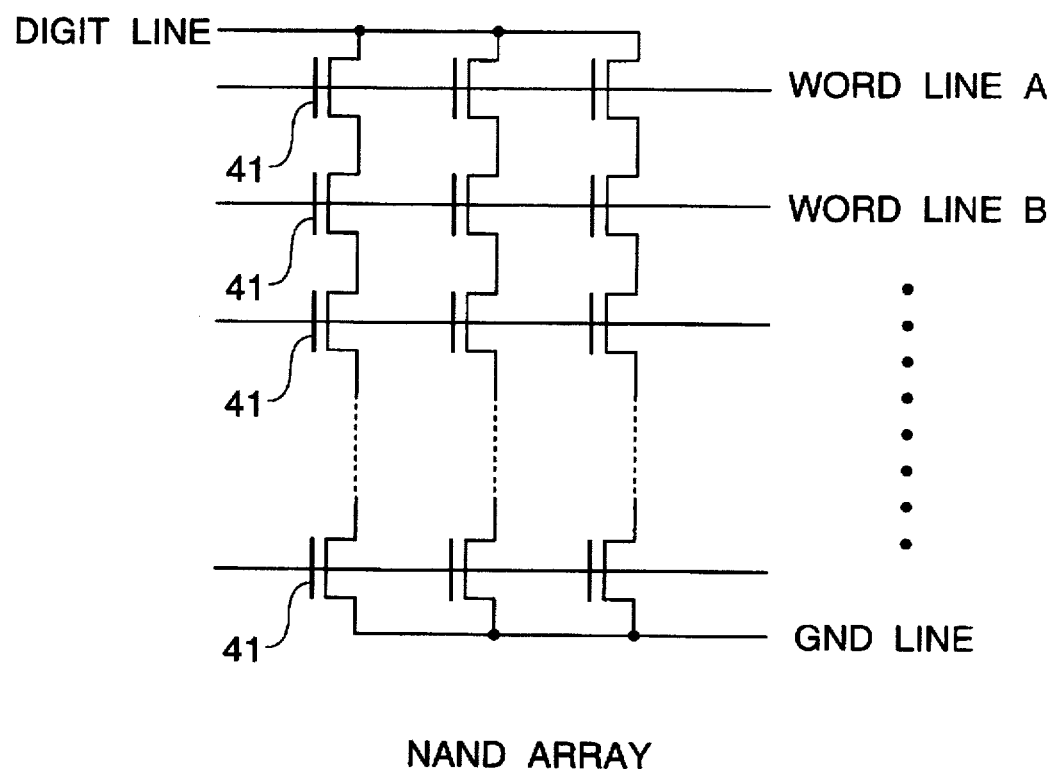
FIG. 8 is a circuit diagram of a memory cell array of the second embodiment of the non-volatile semiconductor memory shown in FIG. 6.

As shown in FIG. 8, a plurality of memory cell transistors included in each one column are connected in series between a digit line and ground, and a gate of memory cell transistors included in each one column are connected to different word lines A, B, . . . , respectively.

Now, a process for manufacturing the second embodiment of the non-volatile semiconductor memory shown in FIG. 6 will be described with reference to FIGS. 7A to 7I.

As shown in FIG. 7A, on a wafer W such as a P-type silicon substrate 14 having an impurity concentration of $8 \times 10^{16}$ $cm^{-3}$, there are deposited, in the named order, a silicon oxide film 33 having a thickness of 25 nm (which will become the first gate insulator film 18), a phosphorus-diffused polysilicon film 34 having a thickness of 300 nm (which will become the control gate electrode 19), a triple-layer insulator film 42 (which will become the second gate insulator film 21) composed of a silicon oxide film having a thickness of 10 nm, a silicon nitride film having a thickness of 12 nm and a silicon oxide film having a thickness of 8 nm, which are stacked in the named order and are depicted as a single layer in FIG. 7A for simplification of the drawing, and a phosphorus-diffused polysilicon film 36A having a thickness of 400 nm (which will finally become a portion of the floating gate electrode 22).

Then, as shown in FIG. 7B, the multi-layer film composed of the polysilicon film 36A, the triple-layer insulator film 42 and the polysilicon film 34, is patterned in accordance with a known manner so as to form a stacked layer structure composed of a first portion 22a of the floating gate electrode, the second gate insulator film 21 and the control gate electrode 19. In addition, source/drain regions 39 are formed in a self-alignment with the patterned stacked layers 22a, 21 and 19. Thereafter, the silicon oxide film 33, which is not covered with the patterned stacked layers 22a, 21 and 19, may be removed as shown in FIG. 7B, but may be or may not be maintained if the first interlayer insulator film 20 to be formed in the next step is formed of the same material as that of the silicon oxide film 33.

Furthermore, as shown in FIG. 7C, in accordance with a known manner, the first interlayer insulator film 20 is deposited on the source/drain regions 39, which are located between the patterned stacked layers 22a, 21 and 19, but a top surface of the patterned stacked layers 22a, 21 and 19 is exposed or maintained in an exposed condition, similarly to the step explained with reference to FIG. 4C.

Figure 7D:
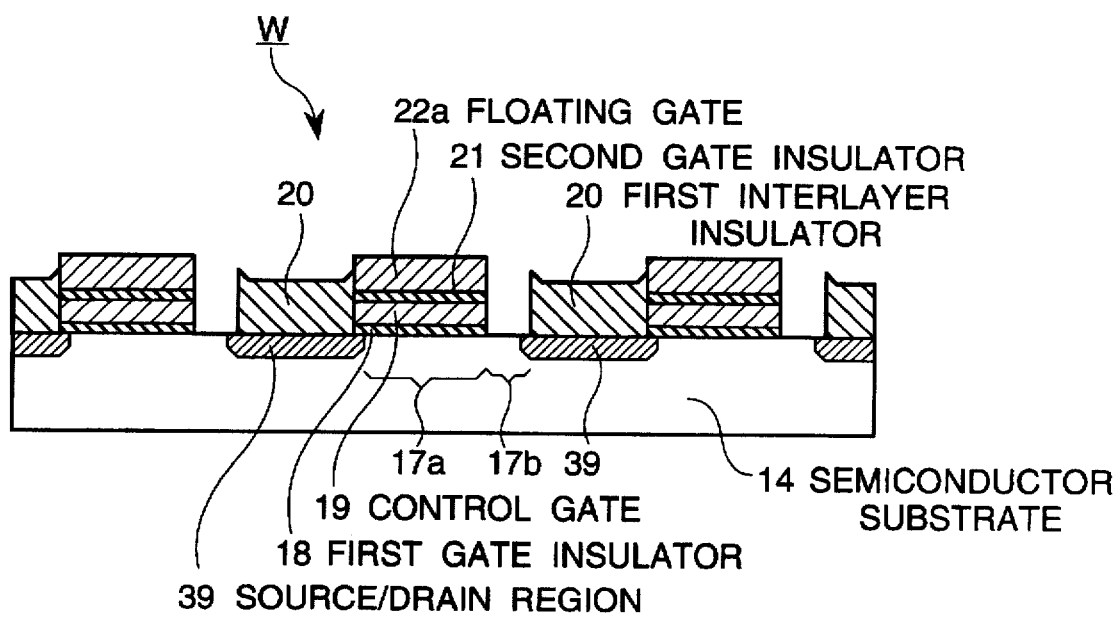

Then, as shown in FIG. 7D, a portion of each stacked structure composed of the patterned stacked layers 22a, 21 and 19 and the first gate insulator film 18, adjacent to one side of each source/drain region 39 in a channel length direction, is selectively etched and removed in accordance with a known manner. A region underneath the remaining stacked layers 22a, 21 and 19 corresponds to the first channel region 17a, and the removed region corresponds to the second channel region 17b.

Figure 7E:
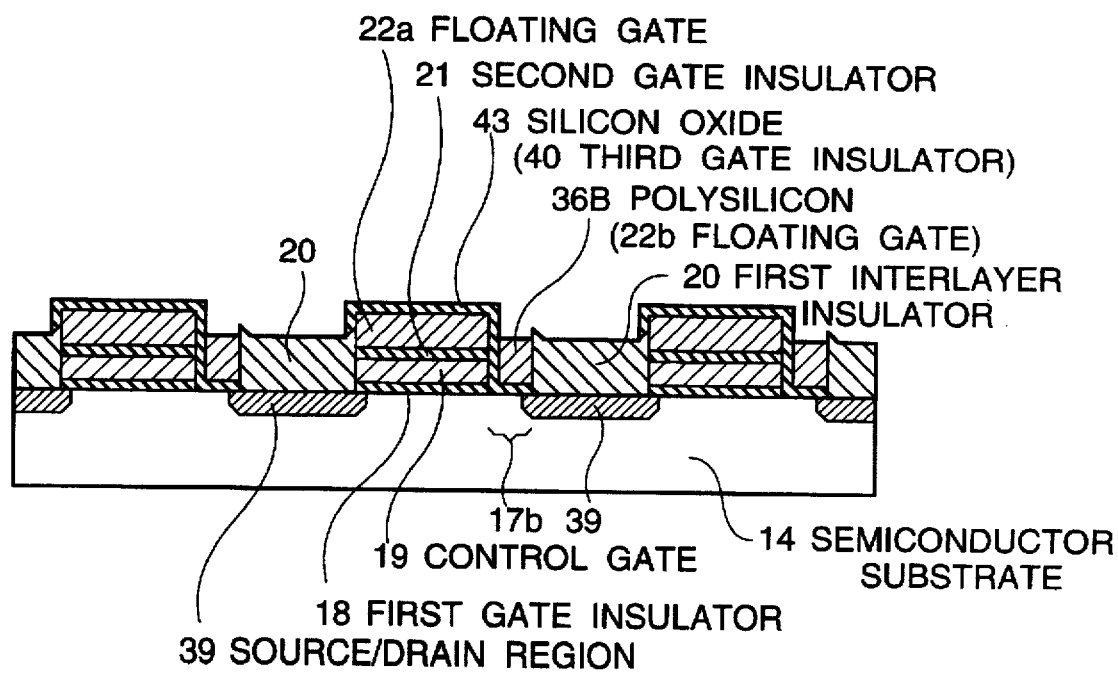

And, as shown in FIG. 7E, a silicon oxide film 43 having a thickness of 8 nm, which will become the third gate insulator film 40, is grown on an upper surface of the remaining stacked layers 22a, 21 and 19, an exposed portion of a side surface of the remaining stacked layers 22a, 21 and 19 which is adjacent to the first interlayer insulator film 20 but is not contacted with the first interlayer insulator film 20, an opposite side surface of the remaining stacked layers 22a, 21 and 19 and an upper surface of the second channel region 17b. Furthermore, a polysilicon film 36B, which will become a second portion of 22b of the floating gate electrode, is grown on the silicon oxide film 43 deposited on the second channel region 17b, in accordance with a know manner.

Figure 7F:
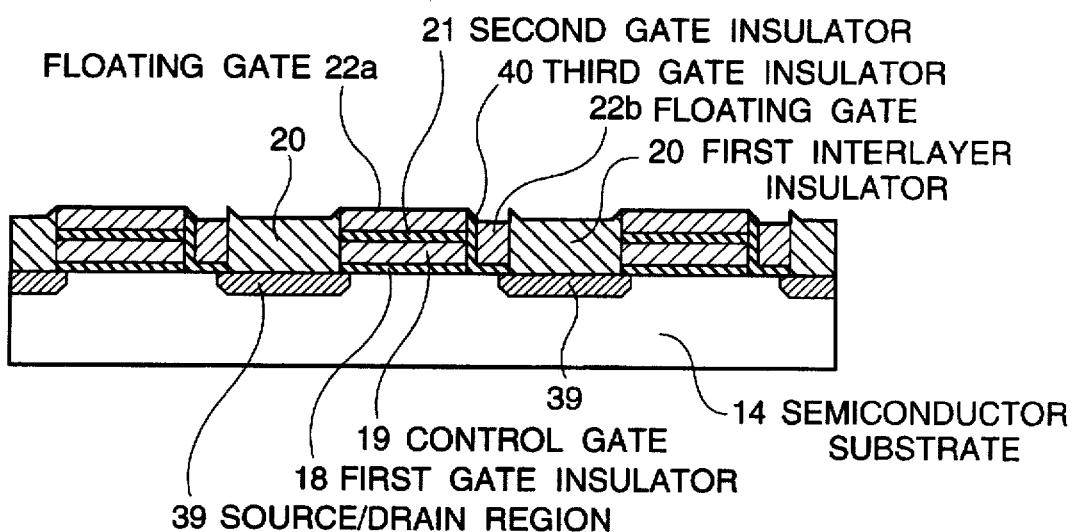
Figure 7G:
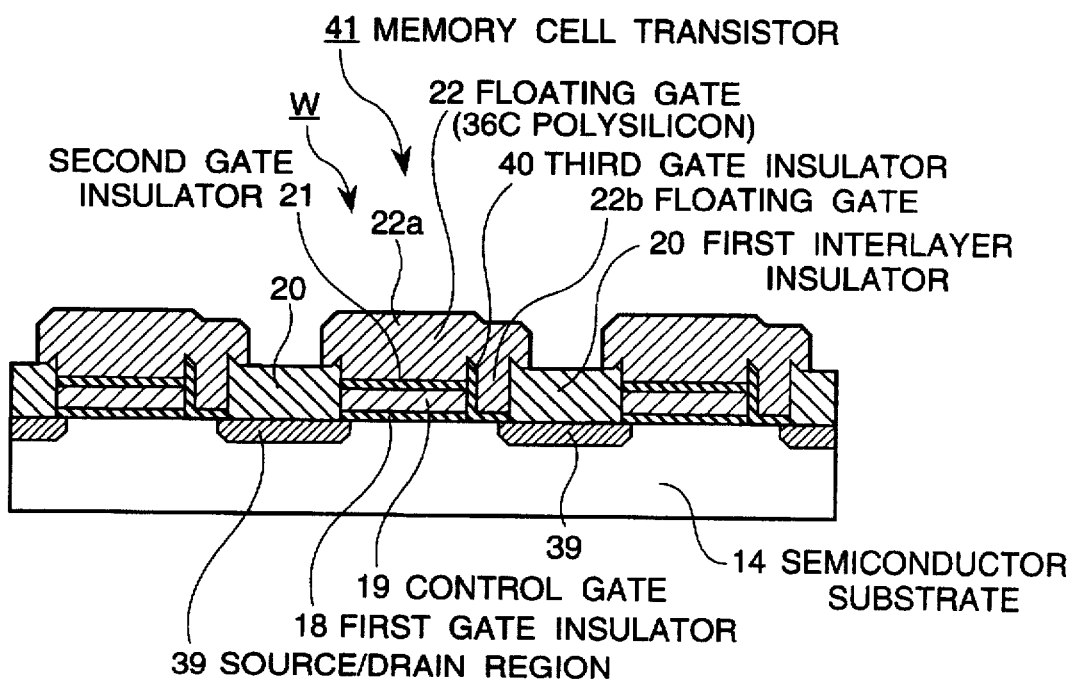

Thereafter, as shown in FIG. 7F, the silicon oxide film 43 is removed from the upper surface of the first portion of 22a of the floating gate electrode. Furthermore, as shown in FIG. 7G, a phosphorus-diffused polysilicon film 36C having a thickness of 150 nm is grown on the whole of the wafer W, and the polysilicon film 36C is patterned in accordance with a known manner so as to form the patterned polysilicon film 36C having opposite ends respectively terminating on the first insulator interlayer insulator film portions 20 and 20 which are located on the pair of source/drain regions 39, respectively, which are positioned at opposite sides of the channel region 17. With this process, the polysilicon film 36C, the polysilicon film 36A (first portion 22a of the floating gate electrode) which is an uppermost layer of the remaining stacked layers 22a, 21 and 19, and the polysilicon film 36B (second portion 22b of the floating gate electrode) deposited on the second channel region 17b, become integral to each other, so as to form the floating gate electrode 22. With the process as mentioned above, the memory cell transistor 41 is formed.

Figure 7H:
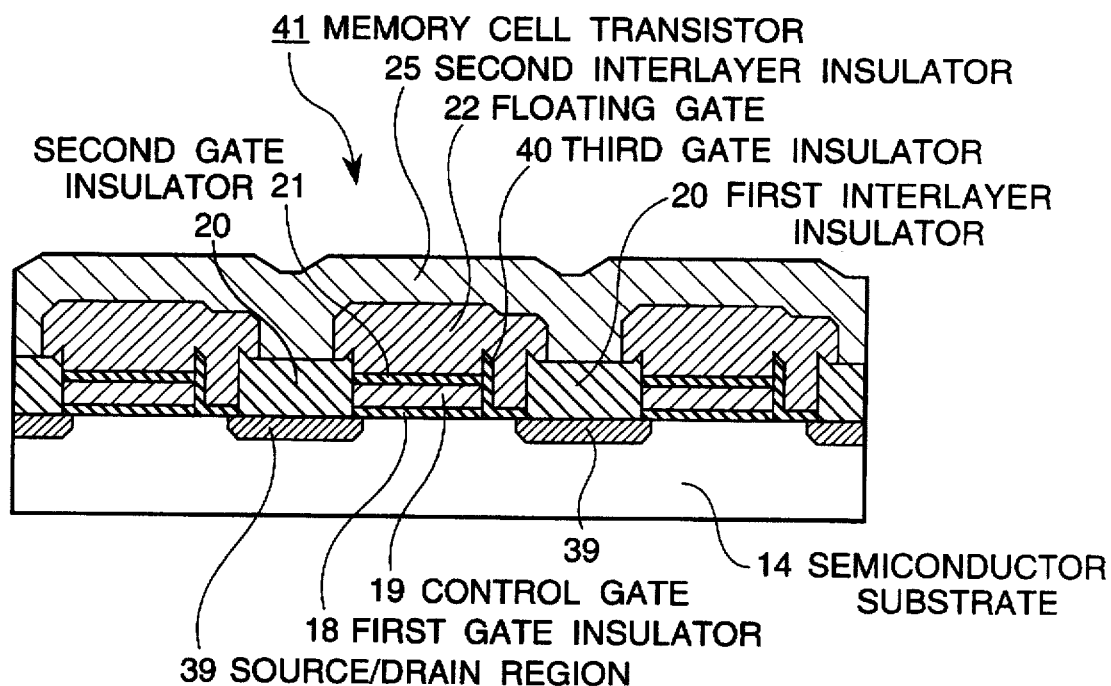

Then, as shown in FIG. 7H, a second interlayer insulator film 25 composed of a BPSG (borophosphosilicate glass) film having a thickness of 800 nm is formed to cover the memory cell transistors 41.

Figure 7I:
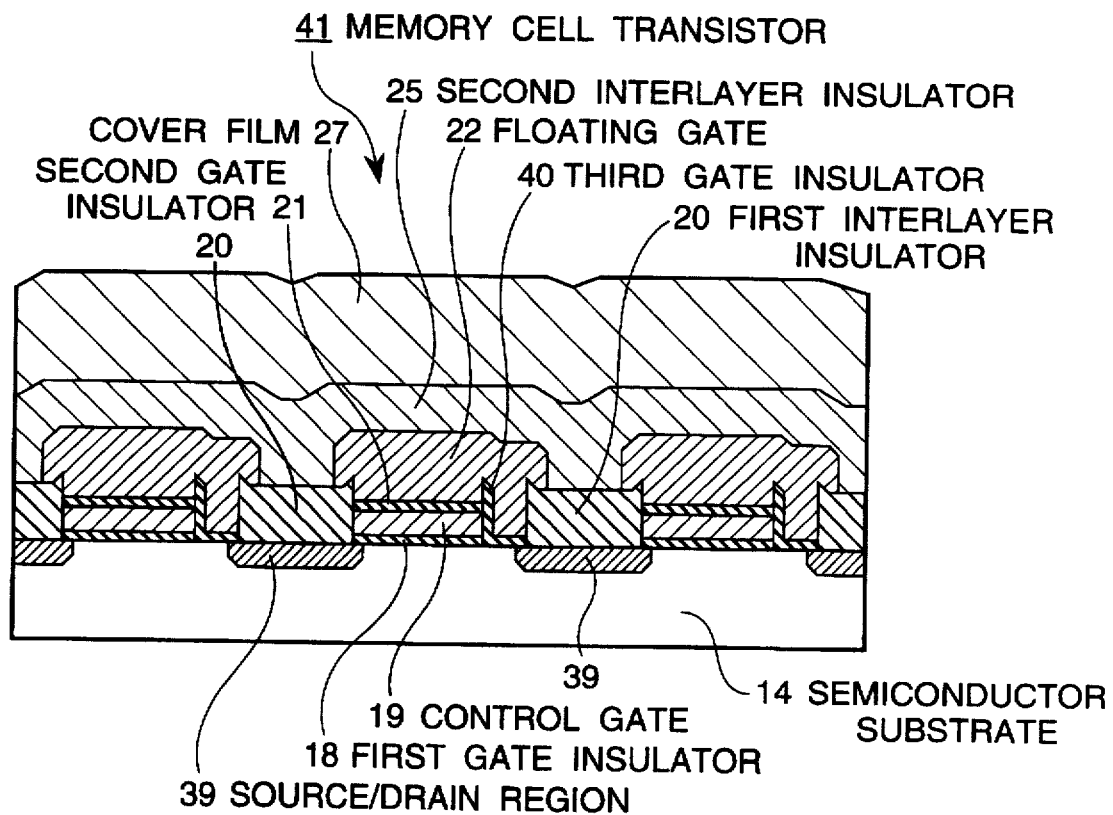

Furthermore, as shown in FIG. 7I, the cover film 27 formed of a PSG (phosphosilicate glass) film having a thickness of 1000 nm, is deposited to cover the second interlayer insulator film 25. Thus, the second embodiment of the non-volatile semiconductor memory is completed.

The above mentioned second embodiment of the manufacturing method in accordance with the present invention can exert the same advantage as those obtained in the first embodiment of the manufacturing method in accordance with the present invention Namely, since the source/drain regions are formed in a self-alignment with the stacked layers composed of the first portion 22a of the floating gate electrode, the second gate insulator film 21 and the control gate electrode 19, the channel length of the memory cell transistor 41 is unambiguously or directly determined, independently of the degree of alignment to the gate electrode. Therefore, variation of the characteristics of the memory cell transistors due to the manufacturing process can be reduced, with the result that the manufacturing yield of the products can be stably maintained at a constant level.

Furthermore, as shown in FIG. 7G, when the overlying floating gate electrode 22 is patterned, it is not necessary at all to etch the underlying control gate electrode 19 in a self-alignment with the overlying floating gate electrode at opposite edges of the overlying floating gate electrode, but it is sufficient if the overlying floating gate electrode is etched until the etching reaches the surface of the first interlayer insulator film 20. Accordingly, the semiconductor substrate is never dug down. Therefore, there occurs no offset between the channel region and the source region, and at the same time, it is possible to avoid damages in the semiconductor substrate, which would otherwise result in a crystal defect becoming a cause of a leak current.

Now, a third embodiment of the non-volatile semiconductor memory in accordance with the present invention will be described with reference to FIG. 9.

This third embodiment includes an underlying floating gate and an overlying control gate, and is of the same type as that of the conventional first type of non-volatile semiconductor memory. In FIG. 9, elements similar to those shown in FIGS. 3 and 6 are given the same Reference Numerals. This third embodiment is characterized in that (1) in a manufacturing process, three stacked layers composed of the control gate electrode, the second gate insulator film and the floating gate electrode are used as a self-aligning mask for forming the source/drain regions, and (2) the structure of the memory cell array is of a virtual ground type.

Figure 6:
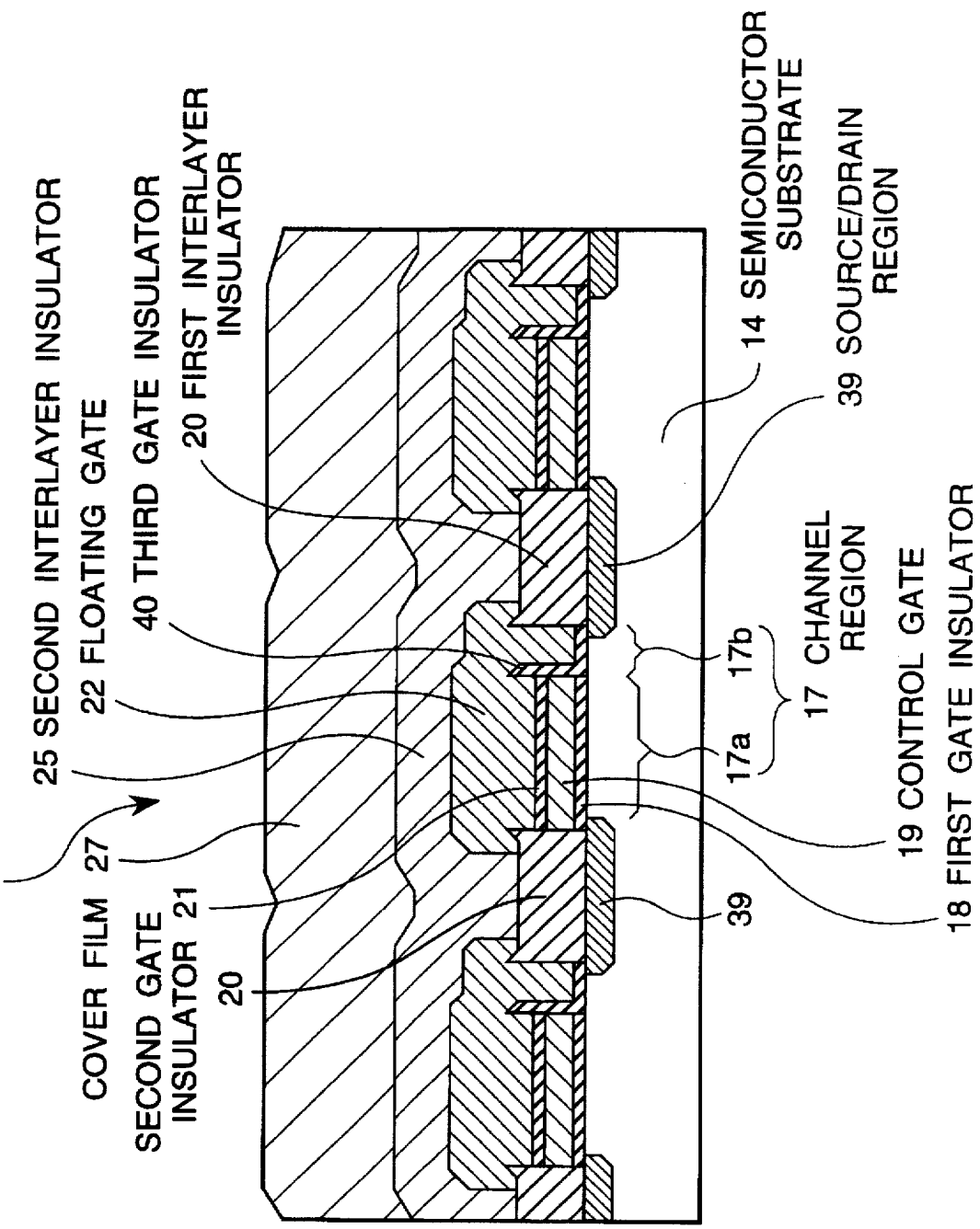
FIG. 6 is a diagrammatic sectional view of a second embodiment of the non-volatile semiconductor memory in accordance with the present invention.
Figure 9:
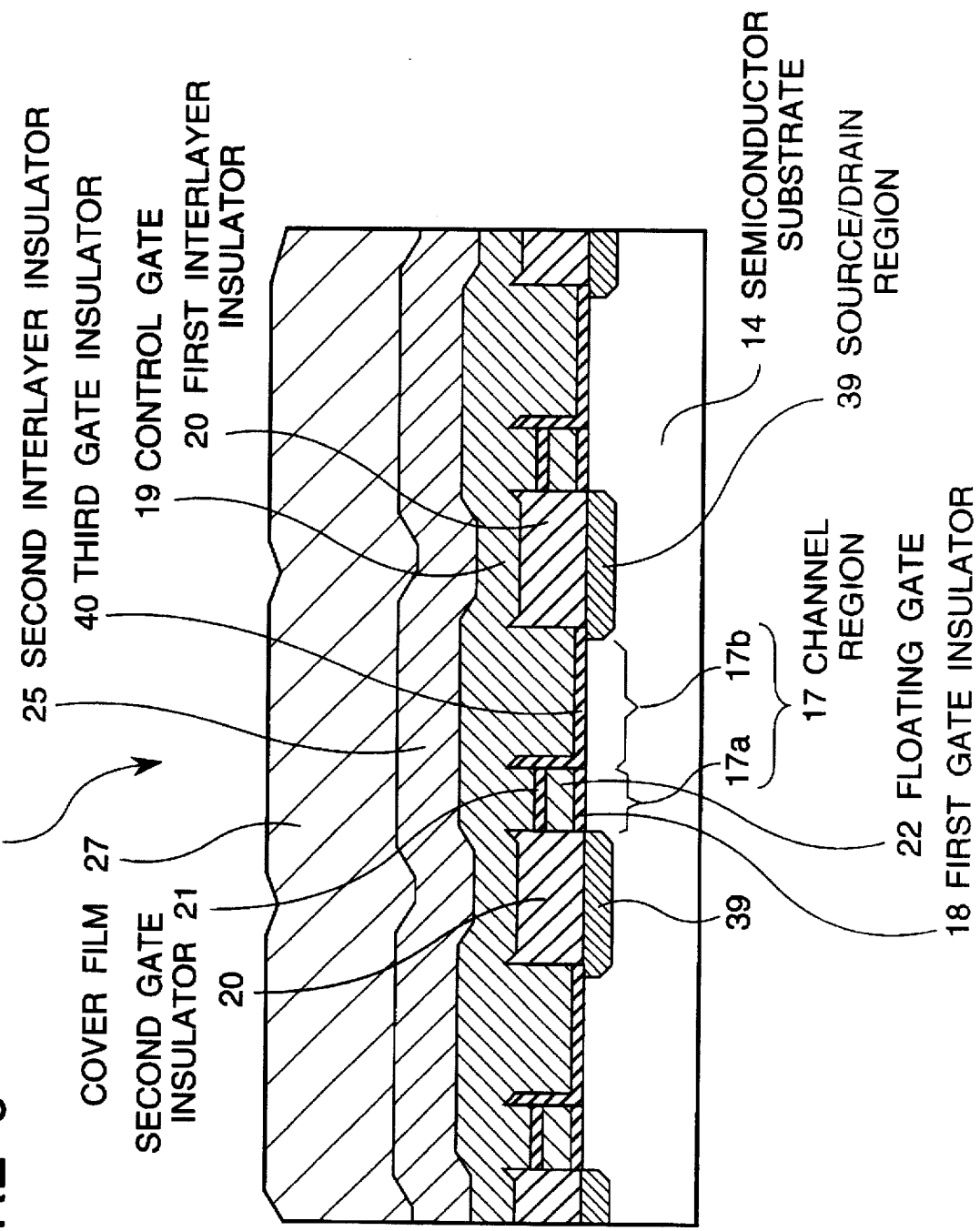
FIG. 9 is a diagrammatic sectional view of a third embodiment of the non-volatile semiconductor memory in accordance with the present invention.
Figure 10:
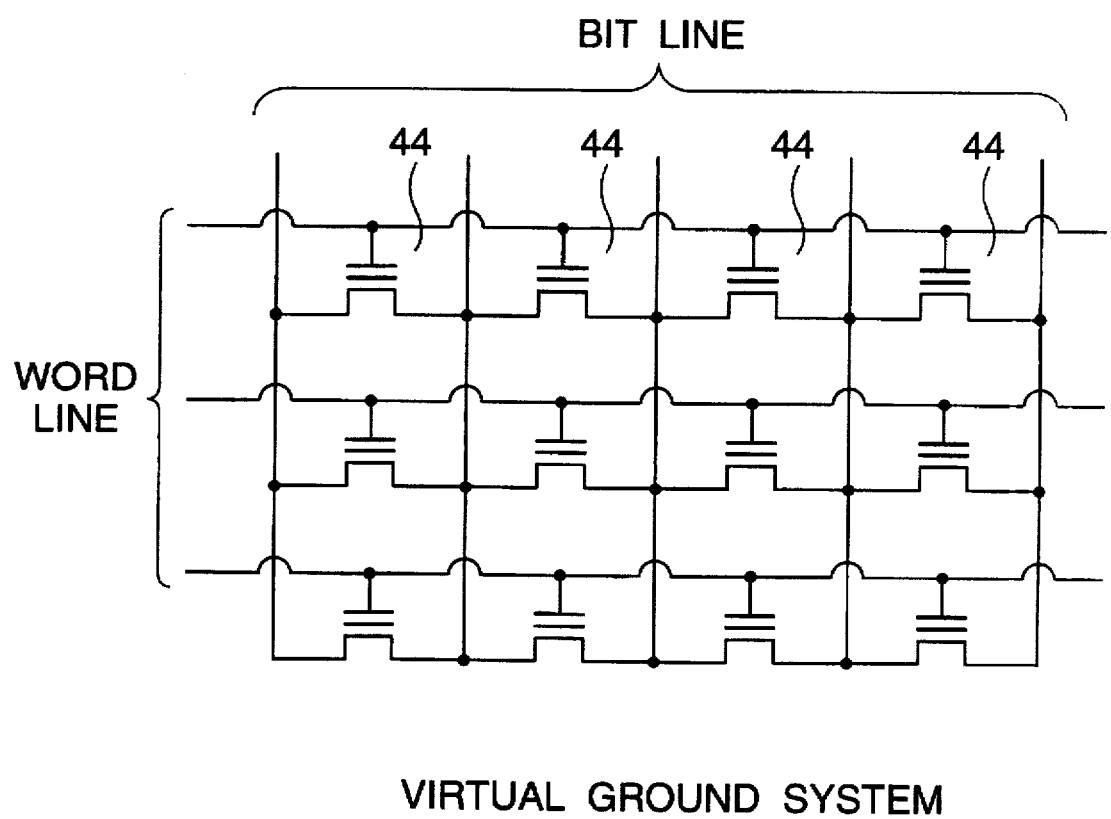
FIG. 10 is a circuit diagram of a memory cell array of the third embodiment of the non-volatile semiconductor memory shown in FIG. 9.

As seen from comparison between FIG. 6 and 9, a memory cell transistor 44 of the third embodiment has a structure similar to that of the memory cell transistor 41 of the second embodiment, excluding the two points, namely, a first point that the floating gate electrode 22 and the control gate electrode 19 are inverted in an upper-and-lower positional relation, and a second point that the overlying control gate electrode 19 covers the whole surface of the first interlayer insulator film 20 which is formed on the source/drain regions 39. The memory cell transistor 44 needs no contact hole, similarly to the second embodiment, and a ground side of the memory cell transistor 44 is changed between the source region and the drain region, depending upon an operating situation. Thus, the virtual ground type memory cell array is constituted as shown in FIG. 10.

Since a process for manufacturing the third embodiment is similar to the process for manufacturing the second embodiment, explanation of the manufacturing process will be omitted. In addition, the third embodiment can exert advantages similar to those obtained in the first and second embodiments.

The specific embodiments of the present invention has been shown and described in the above, but the present invention is in no way limited to the details of the illustrated structures. For example, the kind, film thickness and impurity concentration of each of the films formed in the above mentioned embodiments can be changed or modified in accordance with necessity, without being limited to the specified kind, film thickness and impurity concentration mentioned above. In addition, the present invention can adopt the following modifications:

(1) The structure of the memory cell transistors in each of the above mentioned embodiments is applied to the NOR type memory cell array.

(2) The structure of the memory cell transistors in each of the above mentioned embodiments is applied to the NAND type memory cell array.

(3) The structure of the memory cell transistors in each of the above mentioned embodiments is applied to the virtual ground type memory cell array.

Accordingly, the construction of the contact holes and the wiring conductors adopted in the above mentioned embodiments and the process for manufacturing the construction, are modified upon which of the three memory cell array structures is adopted.

As seen from the above, differently from the conventional non-volatile semiconductor memory having the disadvantage that the channel length of the memory cell transistors is varied or swayed by the degree of alignment between the control gate electrode and the floating gate electrode, the non-volatile semiconductor memory in accordance with the present invention is characterized that, since the source/drain regions are formed in a self-alignment with the underlying gate electrode or the stacked layer structure including the underlying gate electrode, the channel length of the memory cell transistor is unambiguously or directly determined by only the size of the underlying gate electrode. Therefore, variation of the characteristics of the memory cell transistors due to the manufacturing process can be reduced, with the result that the manufacturing yield of the products can be stably maintained at a constant level.

Furthermore, when the overlying gate electrode is patterned, it is not necessary at all to etch the underlying gate electrode, but it is sufficient if the overlying gate electrode is etched until the etching reaches the upper surface of the first interlayer insulator film. Accordingly, the semiconductor substrate is never dug down. Therefore, there occurs no offset between the channel region and the source region, and at the same time, it is possible to avoid damages in the semiconductor substrate, which would otherwise result in a crystal defect becoming a cause of a leak current.

In addition, according to the manufacturing method in accordance with the present invention, it is possible to surely manufacture the non-volatile semiconductor memory having the above mentioned advantages.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory composed of split gate type memory cell transistors each having a floating gate electrode and a control gate electrode, wherein each of the memory cell transistors comprises:

first and second source/drain regions formed at a principal surface of a semiconductor substrate, separately from each other, to form a channel region between said first and second source/drain regions, said channel region being divided into a first channel region adjacent to said first source/drain region and a second channel region adjacent to said second source/drain region;

a first gate insulator film formed on a surface of said first channel region;

a first gate electrode formed on said first gate insulator film and having a pair of opposite side surfaces, a first side surface of said pair of opposite side surfaces being adjacent said first source/drain region and a second side surface of said pair of opposite side surfaces being adjacent said second channel region;

an insulator layer formed on a surface of each of said first and second source/drain regions;

a second gate insulator film formed on an upper surface and said first and second side surfaces of said first gate electrode and on a surface of said second channel region; and a second gate electrode formed on said second gate insulator film and having opposite ends terminating on said insulator layer formed on said surface of said first source/drain region and said insulator layer formed on said surface of said second source/drain region, respectively, wherein one of said first and second gate electrodes constitutes the floating gate electrode, and the other of said first and second gate electrodes constitutes the control gate electrode.

2. The non-volatile semiconductor memory claimed in claim 1 wherein said insulator layer partially covers said first side surface of said first gate electrode, and said second gate insulator film covers a remaining portion of said first side surface of said first gate electrode and completely covers said second side surface of said first gate electrode opposite to said first side surface.

3. The non-volatile semiconductor memory claimed in claim 2 further including an interlayer insulator film formed to cover said second gate electrode and said insulator layer, and a digit line conductor formed on said interlayer insulator film and connected to said first source/drain region through a contact hole formed through said interlayer insulator to reach said first source/drain region.

4. A non-volatile semiconductor memory composed of split gate type memory cell transistors each having a floating gate electrode and a control gate electrode, wherein each of the memory cell transistors comprises:

first and second source/drain regions formed at a principal surface of a semiconductor substrate, separately from each other, to form a channel region between said first and second source/drain regions, said channel region being divided into a first channel region adjacent to said first source/drain region and a second channel region adjacent to said second source/drain region;

a first gate insulator film formed on a surface of said first channel region;

a first gate electrode formed on said first gate insulator film and having a pair of opposite side surfaces, a first side surface of said pair of opposite side surfaces being adjacent said second channel region and a second side surface of said pair of opposite side surfaces being adjacent said first source/drain region;

a second gate insulator film formed on said first gate electrode;

an insulator layer formed on a surface of each of said first and second source/drain regions;

a third gate insulator film formed to cover at least a surface of said second channel region and said first side surface; and a second gate electrode formed on said second and third gate insulator films and having opposite ends terminating on said insulator layer formed on said surface of said first source/drain region and said insulator layer formed on said surface of said second source/drain region, respectively;

wherein one of said first and second gate electrodes constitutes the floating gate electrode, and the other of said first and second gate electrodes constitutes the control gate electrode.

5. The non-volatile semiconductor memory as claimed in claim 4, wherein said insulator layer formed on said surface of said first source/drain region completely covers said second side surface of said first gate electrode, and said third gate insulator film extends upward from said first side surface of said first gate electrode.

6. The non-volatile semiconductor memory claimed in claim 5 further including an interlayer insulator film formed to cover said second gate electrode and said insulator layer.

7. A method for manufacturing a non-volatile semiconductor memory composed of split gate type memory cell transistors each having a floating gate electrode and a control gate electrode, the method comprising the steps of:

(a) forming a first gate electrode on a first gate insulator film formed on a principal surface of a semiconductor substrate;

(b) forming first and second source/drain regions at said principal surface of said semiconductor substrate at opposite sides of said first gate electrode, in a self-alignment with said first gate electrode, so that a channel region is formed at said principal surface of said semiconductor substrate under said first gate electrode;

(c) forming an insulator layer to cover a surface of said first and second source/drain regions;

(d) removing an excess portion of said first gate electrode adjacent to said first source/drain region in a channel length direction, the remaining portion of said first gate electrode having a pair of opposite side surfaces, a first side surface of said pair of opposite side surfaces being adjacent said second source/drain region and a second side surface of said pair of opposite side surfaces being opposite said first side surface;

(e) forming a second gate insulator film on an upper surface and said first and second side surfaces of the remaining portion of said first gate electrode and on said principal surface of said semiconductor substrate from which said excess portion of said first gate electrode has been removed; and (f) forming a second gate electrode to cover said second gate insulator film and to have opposite ends terminating on said insulator layer formed on said surface of said first source/drain region and said insulator layer formed on said surface of said second source/drain region, respectively, wherein one of said first and second gate electrodes constitutes the floating gate electrode, and the other of said first and second gate electrodes constitutes the control gate electrode.

8. The method claimed in claim 7 wherein, in said step (c), said insulator layer is formed to partially cover said first side surface of said first gate electrode but said upper surface of said first gate electrode is put in an exposed condition, and wherein, in said step (e), said second gate insulator film is formed to cover a remaining portion of said first side surface of said first gate electrode and to completely cover said second side surface of said first gate electrode.

9. The method claimed in claim 8 further including the steps of:

(g) forming an interlayer insulator film to cover said second gate electrode and said insulator layer; and (h) forming a digit line conductor on said interlayer insulator film to be connected to said first source/drain region through a contact hole, which is formed through said interlayer insulator to reach said first source/drain region.

10. A method for manufacturing a non-volatile semiconductor memory composed of split gate type memory cell transistors each having a floating gate electrode and a control gate electrode, the method comprising the steps of:

(a) forming on a principal surface of a semiconductor substrate a stacked layer structure composed of a first gate insulator film, a first gate electrode, a second gate insulator film and a first portion of a second gate electrode portion, stacked in the named order;

(b) forming first and second source/drain regions at opposite sides of stacked layer structure, in a self-alignment with said stacked layer structure, so that a channel region is formed under said stacked layer structure;

(c) forming an insulator layer to cover a surface of said first and second source/drain regions;

(d) removing an excess portion of said stacked layer structure adjacent to said first source/drain region in a channel length direction;

(e) forming a third gate insulator film on at least a side surface of a remaining portion of said stacked layer structure and said principal surface of said semiconductor substrate from which said excess portion of said stacked layer structure has been removed;

(f) forming a second portion of said second gate electrode on said third gate insulator formed on said principal surface of said semiconductor substrate;

(g) forming a third portion of said second gate electrode to cover said second portion of said second gate electrode and said first portion of said second gate electrode of said remaining portion of said stacked layer structure and to have opposite ends respectively terminating on said insulator layer formed on said surface of said first source/drain region and said insulator layer formed on said surface of said second source/drain region, wherein one of said first and second gate electrodes constitutes the floating gate electrode, and the other of said first and second gate electrodes constitutes the control gate electrode.

11. The method claimed in claim 10 wherein, in said step (c), said insulator layer is formed to partially cover a first side surface of said stacked layer structure but an upper surface of said stacked layer structure is put in an exposed condition; and wherein, in said step (e), said third gate insulator film is formed to cover an upper surface of the remaining stacked layer structure, a remaining portion of said first side surface of said stacked layer structure and a whole of a second side surface of said stacked layer structure opposite to said first side surface, and said principal surface of said semiconductor substrate from which said excess portion of said first gate electrode has been removed, and then, said third gate insulator film formed to cover said upper surface of the remaining stacked layer structure is selectively removed so that a surface of said first portion of said second gate electrode in the remaining portion of said stacked layer structure is exposed.

12. The method claimed in claim 11 further including the step of:

(h) forming an interlayer insulator film to cover said second gate electrode and said insulator layer.

* * * * *